US010615287B2

(12) United States Patent
Sano et al.

(10) Patent No.: US 10,615,287 B2
(45) Date of Patent: *Apr. 7, 2020

(54) AMORPHOUS OXIDE AND FIELD EFFECT TRANSISTOR

(71) Applicants: CANON KABUSHIKI KAISHA, Tokyo (JP); TOKYO INSTITUTE OF TECHNOLOGY, Kanagawa-ken (JP); Japan Science and Technology Agency, Saitama (JP)

(72) Inventors: Masafumi Sano, Kanagawa-ken (JP); Katsumi Nakagawa, Kanagawa-ken (JP); Hideo Hosono, Kanagawa-ken (JP); Toshio Kamiya, Kanagawa-ken (JP); Kenji Nomura, Kanagawa-ken (JP)

(73) Assignees: CANON KABUSHIKI KAISHA, Tokyo (JP); TOKYO INSTITUTE OF TECHNOLOGY, Tokyo (JP); JAPAN SCIENCE AND TECHNOLOGY AGENCY, Kawaguchi-Shi (JP)

( * ) Notice: Subject to any disclaimer, the term of this patent is extended or adjusted under 35 U.S.C. 154(b) by 26 days.

This patent is subject to a terminal disclaimer.

(21) Appl. No.: 15/402,646

(22) Filed: Jan. 10, 2017

(65) Prior Publication Data
US 2017/0125605 A1 May 4, 2017

Related U.S. Application Data

(60) Continuation of application No. 14/806,108, filed on Jul. 22, 2015, now Pat. No. 9,583,637, which is a continuation of application No. 13/923,009, filed on Jun. 20, 2013, now Pat. No. 9,130,049, which is a division of application No. 12/406,464, filed on Mar. 18, 2009, now abandoned, which is a division of application No. 11/269,600, filed on Nov. 9, 2005, now Pat. No. 7,601,984.

(30) Foreign Application Priority Data

Nov. 10, 2004 (JP) ................. 2004-326687

(51) Int. Cl.
*H01L 29/786* (2006.01)
*H01L 29/66* (2006.01)
*H01L 21/428* (2006.01)
*H01L 21/02* (2006.01)
*H01L 27/12* (2006.01)

(52) U.S. Cl.
CPC .. *H01L 29/78693* (2013.01); *H01L 21/02422* (2013.01); *H01L 21/02554* (2013.01); *H01L 21/02565* (2013.01); *H01L 21/02592* (2013.01); *H01L 21/02631* (2013.01); *H01L 21/428* (2013.01); *H01L 27/124* (2013.01); *H01L 27/1225* (2013.01); *H01L 29/66969* (2013.01); *H01L 29/7869* (2013.01); *H01L 29/78696* (2013.01)

(58) Field of Classification Search
CPC ............. H01L 29/786; H01L 29/772; H01L 29/78603; H01L 29/247; H01L 29/2006; H01L 29/263; H01L 29/06; H01L 29/36; H01L 29/43; H01L 29/4908; H01L 29/78693; H01L 27/1225; H01L 27/124; H01L 29/66969; H01L 29/78696; H01L 21/02422; H01L 21/02554; H01L 21/02565; H01L 21/02592; H01L 21/02631; H01L 21/428; H01L 29/7869; H01L 29/26
USPC ....... 257/57, 52, 65, E31.034; 438/149, 166; 252/519.51, 500, 519.12, 519.13, 520.1, 252/520.21, 519.1
See application file for complete search history.

(56) References Cited

U.S. PATENT DOCUMENTS

| | | | |
|---|---|---|---|
| 5,417,770 A | 5/1995 | Saitoh et al. |
| 5,527,396 A | 6/1996 | Saitoh et al. |
| 5,625,199 A | 4/1997 | Baumbach et al. |
| 5,656,844 A | 8/1997 | Klein et al. |
| 5,899,709 A | 5/1999 | Yamazaki et al. |
| 5,959,312 A | 9/1999 | Tsai et al. |
| 5,960,268 A | 9/1999 | Aihara |
| 6,225,149 B1 | 5/2001 | Gan et al. |
| 6,303,945 B1 | 10/2001 | Saito et al. |
| 6,429,456 B1 | 8/2002 | Takechi et al. |
| 6,445,033 B1 | 9/2002 | Hasegawa |
| 6,472,248 B2 | 10/2002 | Shiozaki et al. |
| 6,635,899 B2 | 10/2003 | Saito et al. |
| 6,737,123 B2 | 5/2004 | Kondo et al. |
| 7,173,232 B2 | 2/2007 | Yagi et al. |
| 7,189,992 B2 | 3/2007 | Wager, III et al. |

(Continued)

FOREIGN PATENT DOCUMENTS

| | | |
|---|---|---|
| EP | 1313134 | 5/2003 |
| EP | 1 443 130 A1 | 8/2004 |

(Continued)

OTHER PUBLICATIONS

Indian Office Action dated Apr. 26, 2017, issued in counterpart IN application 1378/CHENP/2012 (8 pages).
Brazilian Office Action dated May 2, 2017, issued in counterpart BR application PI0517568-2 (10 pages).
Patent Abstracts of Japan, vol. 2000, No. 5, Sep. 2000 for JP2000-44236.
Patent Abstracts of Japan vol. 2002, No. 7, Jul. 2002 for JP 2002-076356.

(Continued)

*Primary Examiner* — Douglas J Mc Ginty
(74) *Attorney, Agent, or Firm* — Venable LLP

(57) ABSTRACT

A novel amorphous oxide applicable, for example, to an active layer of a TFT is provided. The amorphous oxide comprises microcrystals.

28 Claims, 5 Drawing Sheets

(56) References Cited

U.S. PATENT DOCUMENTS

| | | | |
|---|---|---|---|
| 7,297,977 B2* | 11/2007 | Hoffman | H01L 29/7869 257/43 |
| 7,309,895 B2 | 12/2007 | Hoffman et al. | |
| 7,453,065 B2 | 11/2008 | Saito et al. | |
| 7,601,984 B2* | 10/2009 | Sano | H01L 21/428 257/52 |
| 7,622,367 B1 | 11/2009 | Nuzzo et al. | |
| 7,791,072 B2* | 9/2010 | Kumomi | H01L 29/7869 257/57 |
| 7,791,074 B2 | 9/2010 | Iwasaki | |
| 7,829,444 B2* | 11/2010 | Yabuta | H01L 29/78618 257/E21.497 |
| 7,851,792 B2 | 12/2010 | Aiba et al. | |
| 7,855,379 B2 | 12/2010 | Hayashi et al. | |
| 7,868,326 B2 | 1/2011 | Sano et al. | |
| 7,872,259 B2* | 1/2011 | Den | G03G 5/08 257/59 |
| 7,923,723 B2 | 4/2011 | Hayashi et al. | |
| 7,982,216 B2 | 7/2011 | Imai | |
| 8,084,331 B2 | 12/2011 | Ofuji et al. | |
| 8,088,652 B2 | 1/2012 | Hayashi et al. | |
| 8,164,256 B2* | 4/2012 | Sano | H01L 29/7869 313/505 |
| 8,178,926 B2 | 5/2012 | Nakayama | |
| 8,203,143 B2 | 6/2012 | Imai | |
| 8,304,298 B2* | 11/2012 | Ofuji | H01L 27/1233 438/149 |
| 8,314,425 B2 | 11/2012 | Iwasaki et al. | |
| 8,319,214 B2 | 11/2012 | Imai | |
| 8,319,218 B2 | 11/2012 | Yamazaki et al. | |
| 8,581,243 B2* | 11/2013 | Takahashi | H01L 29/7869 257/352 |
| 9,245,959 B2 | 1/2016 | Yamazaki | |
| 9,269,826 B2* | 2/2016 | Hosono | C23C 14/0021 |
| 9,331,156 B2 | 5/2016 | Yamazaki et al. | |
| 9,583,637 B2* | 2/2017 | Sano | H01L 21/428 |
| 2002/0096717 A1 | 7/2002 | Chu et al. | |
| 2002/0115242 A1 | 8/2002 | Joo et al. | |
| 2002/0137267 A1 | 9/2002 | Joo et al. | |
| 2002/0153527 A1 | 10/2002 | Chang et al. | |
| 2002/0167981 A1 | 11/2002 | Eisenbeiser | |
| 2003/0013319 A1 | 1/2003 | Holmes et al. | |
| 2003/0015756 A1 | 1/2003 | Farber et al. | |
| 2003/0017683 A1 | 1/2003 | Emrick et al. | |
| 2003/0184688 A1 | 10/2003 | Kim | |
| 2003/0218222 A1 | 11/2003 | Wager, III et al. | |
| 2004/0127038 A1 | 7/2004 | Carcia et al. | |
| 2004/0155270 A1 | 8/2004 | Hoffman | |
| 2004/0200951 A1 | 10/2004 | Yagi et al. | |
| 2005/0199879 A1 | 9/2005 | Hoffman et al. | |
| 2005/0199960 A1 | 9/2005 | Hoffman et al. | |
| 2006/0113549 A1 | 6/2006 | Den et al. | |
| 2007/0090365 A1 | 4/2007 | Hayashi et al. | |
| 2007/0194379 A1 | 8/2007 | Hosono et al. | |
| 2009/0179199 A1 | 7/2009 | Sano et al. | |

FOREIGN PATENT DOCUMENTS

| | | |
|---|---|---|
| JP | 05-251705 | 9/1993 |
| JP | 07-218460 A | 8/1995 |
| JP | 2000-044236 | 2/2000 |
| JP | 2000-228516 A | 8/2000 |
| JP | 2002-076356 | 3/2002 |
| JP | 2002-289859 | 10/2002 |
| JP | 2003-298062 A | 10/2003 |
| JP | 2004-103957 A | 4/2004 |
| JP | 2004-311784 A | 11/2004 |
| KR | 2004-0093543 | 11/2004 |
| WO | 03/098699 A1 | 11/2003 |
| WO | 2005/074038 A1 | 8/2005 |
| WO | 2005/088726 A1 | 9/2005 |
| WO | 2005/093846 A1 | 10/2005 |
| WO | 2005/093847 A1 | 10/2005 |
| WO | 2005/093848 A1 | 10/2005 |
| WO | 2005/093849 A1 | 10/2005 |
| WO | 2005/093850 A1 | 10/2005 |
| WO | 2005/093851 A1 | 10/2005 |
| WO | 2005/093852 A1 | 10/2005 |

OTHER PUBLICATIONS

Nomura et al., "Carrier Transport in Transparent Amorphous Oxide Semiconductor InGaZnO4", Preprint 31a-ZA-6 of 51st Meeting of Union of Applied Phys. Soc., Mar. 2004, Tokyo University of Technology.

Kamiya et al., "Room Temperature Fabrication and Carrier Transport . . . (>10cm2/Vs)", Preprint 1a-F-5 of 65th Meeting of Applied Phys. Soc., Sep. 2004, Tohoku Gakuen University.

K. Nomura et al., Electron Transport in InGaO3(ZnO)m(m-integer) Studied Using Single-Crystalline Thin Films and Transparent MISFETs, Thin Solid Films, vol. 445, pp. 322-326, 2003.

Extended abstracts. The 65th Autumn Meeting, 2004, the Japan Society of Applied Physics No. 2, abstract 1a-F-5.

Extended abstracts. The 51st Spring Meeting, 2004, The Japan Society of Applied Physics No. 2, abstract 31a-ZA-6.

Japanese Office Action issued in corresponding application No. 2005-325366 dated Oct. 5, 2011—6 pages with translation.

J.R. Bellingham, et al., "Electrical and Optical Properties of Amorphous Indium Oxide", J. Phys.: Condens. Matter 2, pp. 6207-6221 (1990) (XP-001090583).

A.R. Brown, et al., "A Universal Relation Between Conductivity and Field-Effect Mobility in Doped Amorphous Organic Semiconductors", Synthetic Metals, vol. 68, pp. 65-70 (1994).

Canadian Office Action issued in corresponding application No. 2,585,190 dated Jul. 5, 2011—3 pages.

European Office Action issued in corresponding application No. 05806969.1 dated Jul. 13, 2011—5 pages.

Indian Office Action issued in corresponding application No. 2492/CHENP/2007 dated May 9, 2011—3 pages.

M. Orita et al., "Amorphous Transparent Conductive Oxide", Philosophical Magazine B, vol. 81, No. 5 pp. 501-5115 (2001) (XP-002989592).

N. Asakuma, et al., "Photocrystallization of Amorphous ZnO", J. Applied Physics, vol. 92, No. 10, pp. 5707-5710 (2002).

P.K. Song, et al., "Preparation and Crystallization of Tin-Doped and Undoped Amorphous Indium Oxide Films Deposited by Sputtering", Jpn. J. Applied Physics, vol. 38, part 1, No. 9A, pp. 5224-5226 (1999).

Official Action dated Sep. 19, 2008 in CN 2005-80038273.4.

Chinese office action issued in corresponding application No. 201210322249.5 dated Apr. 20, 2015—13 pages.

J. Han, et al., "Defect chemistry and electrical characteristics of undoped and Mn-doped ZnO", J. Euro Ceramic Soc., vol. 22, pp. 49-59 (2002).

Chinese Office Action issued in corresponding application No. 201210322291.7 dated Oct. 8, 2014—14 pages.

European Search Report issued in corresponding application No. 11009313.5 dated Oct. 17, 2014—9 pages.

Canadian Office Action issued in corresponding application No. 2708337 dated Jul. 3, 2013—4 pages.

Canadian Office Action issued in corresponding application No. 2585190 dated Apr. 30, 2014—4 pages.

Nomura et al., "Thin-Film Transistor Fabricated in Single-Crystalline Transparent Oxide Semiconductor", Science, vol. 300, pp. 1269-1272 (2003).

Chinese office action issued in corresponding 201210322249.5 dated Sep. 3, 2014—13 pages.

English Translation of Japanese Patent Application No. 2004-326687, certified Apr. 14, 2011.

Canadian Office Action issued in counterpart application No. 2,708,337 dated Jun. 30, 2014 (2 pages).

European Communication issued in counterpart application No. 11009313.5 dated Jun. 2, 2014, including partial European search report—5 pages.

(56) References Cited

OTHER PUBLICATIONS

European Communication issued in counterpart application No. 11009311.9 dated May 26, 2014, including extended European search report—6 pages.
European Communication issued in counterpart application No. 11009312.7 dated May 27, 2014, including partial European search report—5 pages.
European Communication issued in counterpart application No. 05806969.1 dated May 27, 2014—5 pages.
Office Action dated Aug. 15, 2017, in counterpart Brazilian Patent Application No. PI0517568-2 ( 6 pages including translation).

\* cited by examiner

X in InGaZn$_{1-X}$Mg$_X$O$_4$

AMORPHOUS OXIDE AND FIELD EFFECT TRANSISTOR The present application is a continuation of Ser. No. 14/806,108, filed on Jul. 22, 2015, which is a continuation of U.S. application Ser. No. 13/923,009, filed on Jun. 20, 2013, now issued as U.S. Pat. No. 9,130,049, which is a divisional of U.S. application Ser. No. 12/406,464, filed on Mar. 18, 2009, which is a divisional of U.S. application Ser. No. 11/269,600, filed on Nov. 9, 2005, now issued as U.S. Pat. No. 7,601,984, which claims priority to JP 2004-326687, filed Nov. 10, 2004, the entire disclosure of each of which is incorporated by reference herein.

BACKGROUND OF THE INVENTION

Field of the Invention

The present invention relates to an amorphous oxide. The present invention also relates to a field effect transistor using an amorphous oxide.

Related Background Art

In recent years, flat panel display (FPD) is commercialized as the results of progress of liquid crystal techniques, electroluminescence (EL), and the related techniques. The FPD is driven by an active matrix circuit comprising a field-effect thin film transistor (TFT) employing an amorphous silicon thin film or polycrystalline silicon thin film as the active layer formed on a glass substrate.

For smaller thickness, lighter weight, and higher impact strength of the FPD, use of a lightweight and a flexible resin substrate is investigated in place of the glass substrate. However, the transistor employing the silicon thin film cannot by directly formed on a less heat-resistant resin substrate, since the production of the silicon thin film transistor requires a relatively high-temperature in the process, Therefore, for the TFT, use of an oxide semiconductor thin film such as a ZnO thin film is actively investigated which enables film formation at a lower temperature (Japanese Patent Application Laid-Open No. 2003-298062).

However, TFTs using conventional oxide semiconductor thin films have not provided performances on the same level as of TFTs using silicon.

The present invention relates to an amorphous oxide, and also, to a field effect transistor using the amorphous oxide.

SUMMARY OF THE INVENTION

An object of the present invention is to provide an amorphous oxide for use in the active layer of a semiconductor device such as a thin film transistor (TFT) and serving as a suitable semiconductor, and a field effect transistor.

According to an aspect of the present invention, there is provided a amorphous oxide comprising a microcrystal and having an electron carrier concentration of less than $10^{18}/cm^3$.

The amorphous oxide preferably comprises at least one element selected from the group consisting of In, Zn and Sn.

Alternatively, the amorphous oxide is preferably any one selected from the group consisting of an oxide containing In, Zn and Sn; an oxide containing In and Zn; an oxide containing In and Sn; and an oxide containing In.

Alternatively, the amorphous oxide preferably comprises In, Ga, and Zn.

According to another aspect of the present invention, there is provided an amorphous oxide, wherein electron mobility increases as electron carrier concentration increases. According to a further aspect of the present invention, there is provided a field effective transistor comprising an active layer formed of an amorphous oxide containing a microcrystal, and a gate electrode formed so as to face the active layer via a gate insulator.

The transistor is preferably a normally-off type transistor.

According to a still further aspect of the present invention, there is provided an amorphous oxide whose composition changes in a layer thickness direction and having an electron carrier concentration of less than $10^{18}/cm^3$.

The amorphous oxide preferably contains at least one element selected from the group consisting of In, Zn and Sn.

Alternatively, the amorphous oxide is preferably any one selected from the group consisting of an oxide containing In, Zn and Sn; an oxide containing In and Zn; an oxide containing In and Sn; and an oxide containing In.

Alternatively, the amorphous oxide preferably contains In, Ga and Zn.

According to a still further aspect of the present invention, there is provided a field effect transistor comprising an active layer of an amorphous oxide whose composition changes in a layer thickness direction, and a gate electrode formed so as to face the active layer via a gate insulator, wherein the active layer comprises a first region and a second region, which is closer to the gate insulator than the first region, and the oxygen concentration of the first region is higher than that of the second region.

According to a still further aspect of the present invention, there is provided a field effect transistor comprising an active layer of an amorphous oxide having at least one element selected from the group consisting of In and Zn, and a gate electrode formed so as to face the active layer through a gate insulator, wherein the active layer comprises a first region and a second region, which is closer to the gate insulator than the first region, and the In concentration of the second region is higher than that of the first region, or the Zn concentration of the second region is higher than that of the first region.

According to a still further aspect of the present invention, there is provided an amorphous oxide whose composition changes in a layer thickness direction, wherein electron mobility increases as electron carrier concentration increases.

According to a still further aspect of the present invention, there is provided a field effect transistor comprising an active layer of an amorphous oxide and having at least one element selected from the group consisting of In and Zn, and a gate electrode formed so as to face the active layer via a gate insulator, wherein the active layer comprises a first region and a second region, which is closer to the gate insulator than the first region, and the In concentration of the second region is higher than that of the first region, or the Zn concentration of the second region is higher than that of the first region.

According to a still further aspect of the present invention, there is provided an amorphous oxide comprising one type of element or a plurality of types of elements selected from the group consisting of Li, Na, Mn, Ni, Pd, Cu, Cd, C, N, P, Ti, Zr, V, Ru, Ge, Sn, and F and having an electron carrier concentration of less than $1 \times 10^{18}/cm^3$.

The amorphous oxide preferably comprises at least one element selected from the group consisting of In, Zn and Sn.

Alternatively, the amorphous oxide is preferably any one selected from the group consisting of an oxide containing In, Zn and Sn; an oxide containing In and Zn; an oxide containing In and Sn; and an oxide containing In.

Alternatively, the amorphous oxide preferably comprises In, Zn and Ga.

According to a still further aspect of the present invention, there is provided an amorphous oxide comprising at least one type of element selected from group consisting of Li, Na, Mn, Ni, Pd, Cu, Cd, C, N, P, Ti, Zr, V, Ru, Ge, Sn, and F, wherein electron mobility increases as electron carrier concentration increases.

According to a still further aspect of the present invention, there is provided a field effect transistor comprising an active layer of an amorphous oxide containing at least one type of element selected from the group consisting of Li, Na, Mn, Ni, Pd, Cu, Cd, C, N, P, Ti, Zr, V, Ru, Ge, Sn, and F; and a gate electrode formed so as to face the active layer via a gate insulator.

Further, in the present invention, the amorphous oxide is preferably selected from the group consisting of an oxide containing In, Zn and Sn; an oxide containing In and Zn; an oxide containing In and Sn; and an oxide containing In.

As the results of investigation on the oxide semiconductors by the inventors of the present invention, it was found that the above-mentioned ZnO is formed in a state of a polycrystalline phase, causing scattering of carriers at the interface between the polycrystalline grains to lower the electron mobility. Further it was found that ZnO is liable to cause oxygen defect therein to produce many carrier electrons, which makes difficult to lower the electrical conductivity. Thereby, even when a gate voltage is not applied to the transistor, a large electric current flow is caused between the source terminal and the drain terminal, making impossible the normally-off state of the TFT and a larger on-off ratio of the transistor.

The inventors of the present invention investigated the amorphous oxide film $Zn_xM_yIn_zO_{(x+3y/2+3z/2)}$ (M: at least one element of Al and Ga) mentioned in Japanese Patent Application Laid-Open No. 2000-044236. This material contains electron carriers at a concentration not less than $1\times10^{18}/cm^3$, and is suitable as a simple transparent electrode. However, the oxide containing the electron carrier at a concentration of not less than $1\times10^{18}/cm^3$ used in a channel layer of TFT cannot give a sufficient on-off ratio, and is not suitable for the normally-off TFT. Thus a conventional amorphous oxide film cannot provide a film of a carrier concentration of less than $1\times10^{18}/cm^3$.

The inventors of the present invention prepared a TFT by use of an amorphous oxide of a carrier concentration of less than $1\times10^{18}/cm^3$ as an active layer of a field-effect transistor. The TFT was found to have desired properties and to be useful for an image display apparatus like a light emission apparatus.

Further, the inventors of the present invention investigated a material $InGaO_3(ZnO)_m$ and the film forming conditions of this material, and found that the carrier concentration of this material can be controlled to be less than $1\times10^{18}/cm^3$ by controlling the oxygen atmosphere conditions in the film formation.

The above explanation is given with a view to a case of using the amorphous oxide as an active layer serving as e.g. a channel layer of TFT. The present invention is, however, not so limited to the case wherein such an active layer is used.

In the above, mention is mostly made of a case where an amorphous oxide is used as the active layer serving as the channel of a TFT. However, the present invention is not limited to the case.

According to the present invention, there is provided an amorphous oxide that is suitably used in the channel layer of a transistor, for example, a TFT. The present invention also provides a field effect transistor having excellent properties.

DETAILED DESCRIPTION OF THE PREFERRED EMBODIMENTS

Figure 1:
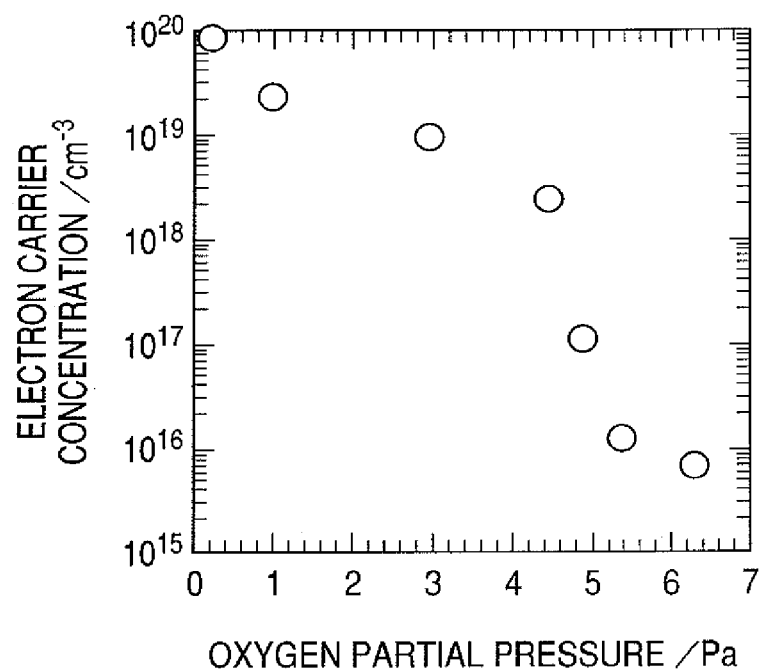
FIG. 1 is a graph showing the relationship between the electron carrier concentration of an In—Ga—Zn—O based amorphous film formed by a pulse laser deposition method and the oxygen partial pressure during film formation time.

Now, the first to third inventions will be explained in accordance with first to third embodiments, respectively. After that, an amorphous oxide material applicable to the present invention will be explained. In the embodiments below, an In—Ga—Zn—O based oxide will be mainly explained in the embodiments below; however, the present invention is not limited to such material.

First Embodiment: Amorphous Oxide Having a Microcrystals

The invention according to the first embodiment relates to an amorphous oxide, characterized in that the amorphous contains a microcrystal(s). Where a microcrystal(s) are contained or not in the amorphous oxide is determined by taking a TEM (transmission electron microscopic) photograph of a section of a formed amorphous oxide film. An amorphous oxide film according to the present invention comprises In—Ga—Zn—O and the composition of the amorphous oxide film in a crystalline state is represented by $InGaO_3(ZnO)_m$ (m is a natural number of less than 6).

Oxides represented by the term "amorphous oxide" in the specification has an electron carrier concentration is less than $10^{18}/cm^3$ or shows a tendency that the electron mobility increases as the electron carrier concentration increases, or and so forth. Although depending on the kind of use of a TFT, it is preferable to use the amorphous TFT for fabricating normally off type TFT.

Alternatively, an amorphous oxide film according to the present invention comprises In—Ga—Zn—Mg—O and the composition of the amorphous oxide film in a crystalline state is represented by $InGaO_3(Zn_{1-x}Mg_xO)_m$ (m is a natural number of less than 6, $0<x\leq1$). It is preferable that these amorphous oxide films have an electron mobility exceeding 1 $cm^2/V\cdot sec$.

The present inventors found that use of such a film mentioned above as a channel layer makes it possible to form a flexible TFT having transistor characteristics: a gate current of less than 0.1 micro ampere when the TFT is off (normally-off) and an on/off ratio exceeding $1\times10^3$, and being permeable to visible light.

Such a transparent film is characterized in that the electron mobility increases with an increase of the number of conductive electrons. As a substrate for forming the transparent film, use can be made of a glass substrate, plastic substrate and plastic film.

When the transparent oxide film is used as the channel layer of a transistor, it is preferable to employ, as the gate insulator, one type of compound selected from the group consisting of $Al_2O$—$Y_2O_3$ and $HfO_2$ or a mixed crystal compound containing at least two types selected from the group consisting of $Al_2O_3$, $Y_2O_3$ and $HfO_2$.

It is preferable that the film (transparent oxide film) is formed in an atmosphere containing oxygen under light irradiation without adding impurity ions for enhancing electric resistance on purpose.

<Film Composition>

In a transparent amorphous oxide thin film, which has a composition in a crystalline state represented by $InGaO_3(ZnO)_m$ (m is a natural number of less than 6), the amorphous state can be stably maintained to a temperature as high as 800° C. or more if the value m is less than 6. However, as the value m increases, in other words, the ratio of ZnO to $InGaO_3$ increases (that is, the composition of the film becomes closer to ZnO), the film comes to be easily crystallized For this reason, it is preferable that the value m is less than 6 when the amorphous film is used as the channel layer of an amorphous TFT. However, it is found that when the film is formed under light irradiation, microcrystals can be formed even though the value m is small.

The film may be formed by a vapor-phase film formation method with a polycrystalline-sintered body having a composition of $InGaO_3(ZnO)_m$ used as a target. Of the vapor-phase film formation methods, a sputtering method and a pulse laser deposition method are suitable. Moreover, the sputtering method is most preferable in view of large-scale production.

However, such an amorphous film is formed in general conditions, mainly oxygen defect occurs. Therefore, an electron carrier concentration has not yet been reduced to less than $1\times10^{18}/cm^3$, in other words, 10 S/cm or less in terms of electric conductivity. When such a conventional thin film is used, a normally-off transistor cannot be formed. However, when a transparent amorphous oxide film, which has a composition of In—Ga—Zn—O and a crystalline state composition represented by $InGaO_3(ZnO)_m$ (m is a natural number of less than 6), is formed by a pulse laser deposition method using the apparatus shown in FIG. 7, in an atmosphere having a high oxygen partial pressure in excess of 3.2 Pa, the electron carrier concentration can be reduced to less than $1\times10^{18}/cm^3$. In this case, the substrate is not purposely heated and therefore maintained approximately at room temperature. When a plastic film is used as a substrate, the temperature of the plastic film is preferably maintained at less than 100° C.

According to the invention of this embodiment, an amorphous oxide comprises In—Ga—Zn—O and formed by a pulse laser deposition method under light irradiation. More specifically, the invention is directed to a transparent amorphous oxide thin film containing a microcrystal(s) represented by a crystalline state composition of $InGaO_3(ZnO)_m$ (m is a natural number of less than 6). A normally-off transistor can be formed by use of such a thin film.

In such a thin film, it is possible to obtain an electron mobility exceeding 1 $cm^2/V\cdot sec$ and a large on/off ratio exceeding $1\times10^2$.

Furthermore, the present invention is directed to an amorphous oxide comprising In—Ga—Zn—O and formed by a sputtering method using argon gas under light irradiation. More specifically, the present invention is directed to a transparent amorphous oxide thin film containing a microcrystal(s) represented by a crystalline state composition, $InGaO_3(ZnO)_m$ (m is a natural number of less than 6). Such a film can be obtained by a sputtering method using the apparatus shown in FIG. 8 in an atmosphere having a high oxygen partial pressure in excess of $1\times10^{-2}$ Pa. In this case, the temperature of the substrate is not purposely heated and thus maintained approximately at room temperature. When a plastic film is used as a substrate, the substrate temperature is preferably maintained at less than 100° C. The number of electron carriers can be reduced by further increasing oxygen partial pressure.

More specifically, the present invention is directed to an amorphous oxide comprising In—Ga—Zn—O prepared by a sputtering deposition method under light irradiation. According to the present invention, a normally-off transistor having an on/off ratio exceeding $1\times10^3$ can be formed by using a transparent amorphous oxide thin film containing a microcrystal(s) represented by a crystalline state composition of $InGaO_3(ZnO)_m$ (m is a natural number of less than 6).

In the thin film prepared by a pulse laser deposition method and a sputtering method under light irradiation, the electron mobility increases with an increase of the number of conductive electrons.

In this case, if a polycrystalline $InGaO_3(Zn_{1-x}Mg_xO)_m$ (m is a natural number of less than 6, $0<x\leq1$) is used as a target, a high resistance amorphous film having a composition of $InGaO_3(Zn_{1-x}Mg_xO)_m$ can be obtained even under a partial oxygen pressure of less than 1 Pa.

Figure 7:
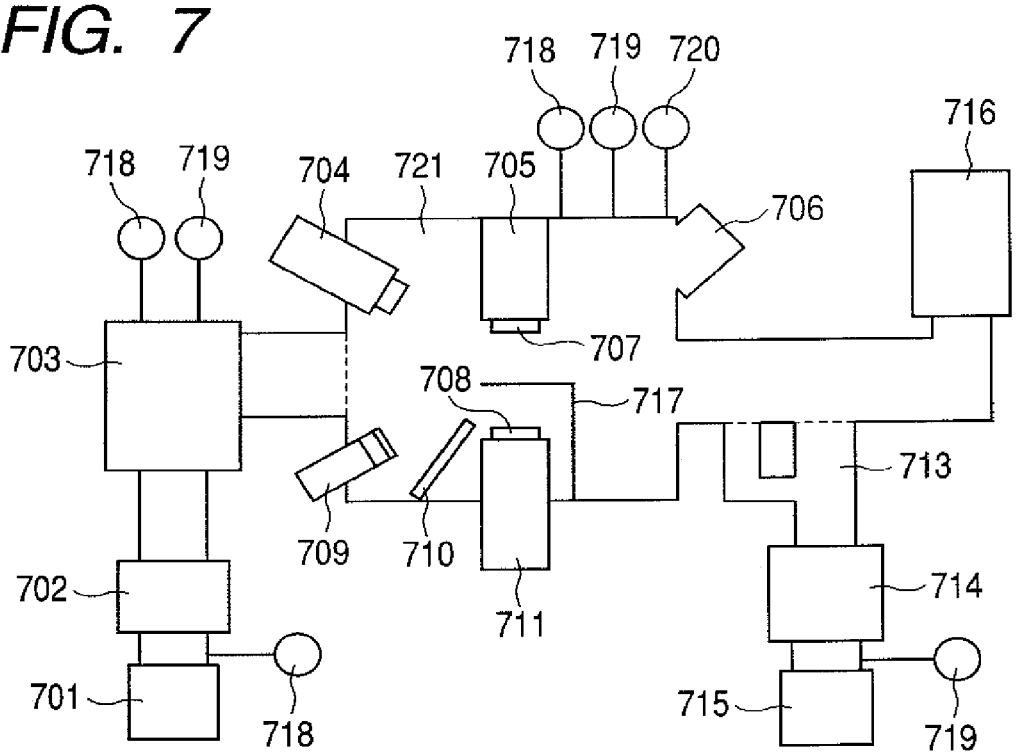
FIG. 7 is a schematic illustration of a film formation apparatus employing the pulse laser deposition method.
Figure 8:
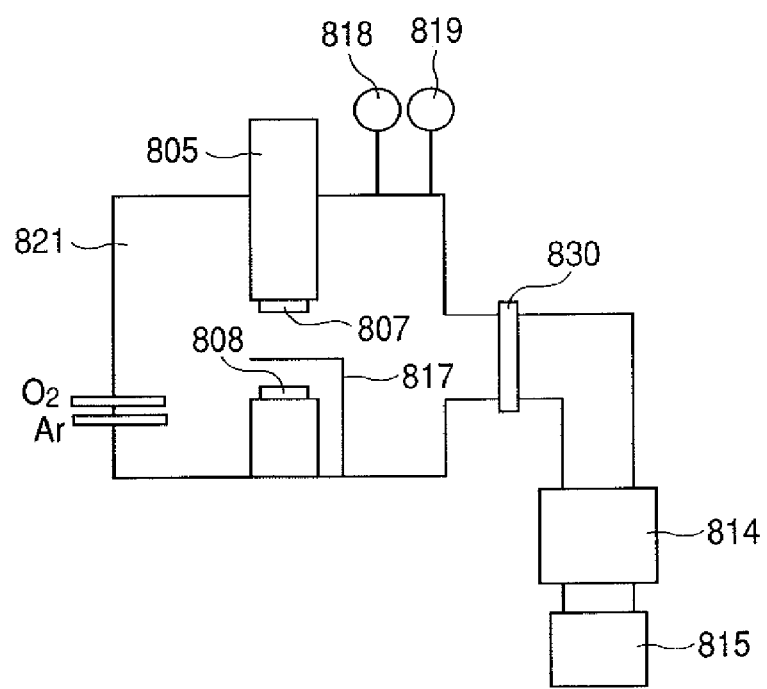
FIG. 8 is a schematic illustration of a film formation apparatus employing the sputtering method.

As explained above, oxygen defect can be overcome by controlling oxygen partial pressure. As a result, the electron carrier concentration can be reduced without adding predetermined impurity ions. An amorphous oxide according to the present invention can be obtained by forming a thin film according to any one of FIGS. 1 to 5 under light irradiation. When apparatuses according to FIGS. 7 and 8 are used, a film can be formed at an oxygen partial pressure, for example, within the predetermined range described later. In the amorphous state containing a microcrystal(s), the grain boundary interface of a microcrystal is covered with (surrounded by) an amorphous structure. Therefore, the grain boundary interface capable of trapping mobile electrons and holes does not virtually exist, unlike the polycrystalline state like zinc oxide. As a result, an amorphous thin film having high electron mobility can be obtained. Furthermore, the number of conductive electrons can be reduced without adding predetermined impurity ions. Since electrons are not scattered by the impurity ions, high electron mobility can be maintained. The microcrystals according to the present invention are not limited to that having a composition represented by InGaO$_3$(ZnO)$_m$ (m is a natural number of less than 6).

In a thin film transistor employing the transparent film mentioned above, the gate insulator is preferably formed of a mixed crystal compound containing at least two compounds selected from the group consisting of Al$_2$O—Y$_2$O$_3$ and HfO$_2$. When a defect (deficiency) is present in the interface between the gate insulating thin film and the channel layer thin film, the electron mobility decreases and hysteresis as a transistor characteristic, takes place. Furthermore, if the types of gate insulators differs, leak current greatly varies. For this reason, it is necessary to select a suitable gate insulator for the channel layer. If an Al$_2$O$_3$ film is used (as the gate insulator), the leak current can be reduced. If an Y$_2$O$_3$ film is used, the hysteresis can be reduced. If an HfO$_2$ film having a high dielectric constant is used, the electron mobility can be increased. Furthermore, if a mixed crystal of these compounds is used (as a gate insulator), leak current, it is possible to form a TFT having a small leak current and hysteresis, and large electron mobility. Since a gate insulator formation process and a channel layer formation process can be performed at room temperature, not only a stagger-structure TFT but also an inverse-stagger structure TFT may be formed.

A TFT is a device having three terminals, namely, a gate terminal, source terminal and drain terminal. In the TFT, a semiconductor thin film formed on an insulating substrate such as ceramic, glass, or plastic substrate is used as a channel layer for migrating electrons and holes therethrough. The current flowing through the channel layer is controlled by applying a voltage to the gate terminal, thereby switching the current between the source terminal and the drain terminal. Since the TFT has such a switching function, it is an active device. Note that microcrystals contained in an amorphous oxide may be formed by light irradiation (specifically, light irradiation by a halogen lamp or UV irradiation) as mentioned above and may be formed by other methods except for light irradiation.

Second Embodiment: Compositional Distribution of Amorphous Oxide

According to this embodiment, an amorphous oxide is characterized by a composition varying in a film-thickness direction.

The phrase "composition varying in a film-thickness direction" means that the oxygen amount contained in an oxide changes in the film thickness direction and elements constituting an oxide changes in the middle (that is, the composition changes), and the contents of the elements constituting an oxide change.

Therefore, when the amorphous oxide is used as the active layer (also called channel layer) of a field effect transistor, for example, the following constitution is preferable. In a transistor having an active layer containing an amorphous oxide and a gate insulator in contact with each other at an interface, the amorphous oxide layer is constituted such that the concentration of oxygen near the interface is set higher than the region away from the interface. In this case, since the electric resistance of the amorphous oxide layer near the interface is high, the so-called channel of the transistor is formed within the amorphous oxide layer away from the interface. Such a constitution is preferable when the interface is a rough surface, because current leakage can be reduced.

That is, in case of using the above amorphous oxide as an active layer of the transistor, it is preferable to design the active layer so as to be comprised of the first region and the second region more adjacent to the gate insulator than the first region, the concentration of oxygen in the second region is greater than the that in the first region. Incidentally, the two regions are not necessary to be distinguishable at a boundary of them but may change their respective compositions gradually or step by step.

In particular, the electron carrier concentration of the amorphous oxide is preferably less than $1^{18}$/cm$^3$.

A direction of the film formed on the substrate means any direction which is not in the direction in plane of the substrate, e.g. the direction perpendicular to the direction in plane of the substrate. Furthermore, in a transistor having an active layer formed of an amorphous oxide having at least one element selected from the group consisting of In and Zn and a gate insulator in contact with the active layer at the interface, the concentration of In or Zn contained in the region of the amorphous oxide layer (active layer) close to the interface is higher than the region away from the interface. In this case, the electron field-effect mobility can be enhanced.

That is, in case of using the above amorphous oxide as an active layer of the transistor, it is preferable to design the active layer so as to be comprised of the first region and the second region more adjacent to the gate insulator than the first region, the concentration of In or Zn in the second region is greater than the that in the first region.

According to the second invention, an oxide film comprises In—Ga—Zn—O and its composition changes in the film-thickness direction, and characterized in that the composition of a crystalline-state portion is represented by InGaO$_3$(ZnO)$_m$ (m is a natural number of less than 6) and an electron carrier concentration is less than $1\times10^{18}$/cm$^3$.

Alternatively, an oxide film according to the second invention is a transparent amorphous oxide film comprising In—Ga—Zn—Mg—O and characterized in that the composition changes in a film-thickness direction and the composition of a crystalline state portion is represented by InGaO$_3$(Zn$_{1-x}$Mg$_x$O)$_m$ (m is a natural number of less than 6, 0<x≤1) and an electron carrier concentration is less than $1\times10^{18}$/cm$^3$. Note that, it is also preferable that these films have an electron mobility exceeding 1 cm$^2$/V·sec.

When the aforementioned film is used as the channel layer, it is possible to obtain a flexible TFT having transistor characteristics: a gate current of less than 0.1 micro ampere when TFT is off (normally-off), an on/off ratio exceeding $1\times10^4$, and being permeable to visible light.

Note that, such a transparent film is characterized in that the electron mobility increases with an increase of the number of conductive electrons. As a substrate for forming the transparent film, use can be made of a glass substrate, plastic substrate or plastic film.

When the transparent oxide film is used as the channel layer of a transistor, it is preferable to employ one type of compound selected from the group consisting of Al$_2$O—Y$_2$O$_3$ and HfO$_2$ or a mixed crystal compound containing at least two types of compounds selected from the group consisting of Al$_2$O$_3$, Y$_2$O$_3$ and HfO$_2$ as the gate insulator.

It is preferable that the film (transparent oxide film) is formed in an atmosphere containing oxygen without adding impurity ions for enhancing electric resistance on purpose.

The present inventors found a specific feature of the semi-insulating amorphous oxide thin film. That is, the electron mobility increases with an increase of the number of conductive electrons. They formed a TFT using this film and found that the characteristics of the transistor, such as an on/off ratio, saturation current at a pinch-off state, and switching speed, further increase.

In a film transistor formed by using the transparent semi-insulating amorphous oxide thin film as the channel layer, when an electron mobility is more than 1 cm$^2$/V·sec, preferably more than 5 cm$^2$/V·sec, and an electron carrier concentration to less than $1 \times 10^{18}$/cm$^3$, preferably, less than $1 \times 10^{16}$/cm$^3$, the current between the drain and source terminals in the off time (gate voltage is not applied) can be reduced to less than 10 micro ampere, preferably, less than 0.1 micro ampere. Further, in this case (of using the aforementioned thin film), when an electron mobility is more than 1 cm$^2$/V·sec, preferably more than 5 cm$^2$/V·sec, the saturation current after the pinch off can be increased to more than 10 micro ampere. In short, an on/off ratio can be increased to more than $1 \times 10^4$.

In a TFT, a high voltage is applied to a gate terminal in a pinch off state, with the result that electrons are present at a high density in the channel. Therefore, according to the present invention, the saturation current can be increased by the extent corresponding to an increase of electron mobility. As a result, almost all characteristics of the transistor, such as an on/off ratio, saturation current, and switching rate, are increased and improved. Note that, in a general compound, when the number of electrons increases, collision between electrons takes place, with the result that the electron mobility decreases.

The amorphous oxide according to the present invention can be used in a staggered (top gate) structure TFT in which the gate insulator and the gate terminal are sequentially formed in this order on the semiconductor channel layer and in an inverse staggered (bottom gate) structure TFT in which the gate insulator and the semiconductor channel layer are sequentially formed in this order on the gate terminal.

<Film Composition>

In a transparent amorphous oxide thin film whose crystalline portion has a composition represented by InGaO$_3$(ZnO)$_m$ (m is a natural number of less than 6), when the value m is less than 6, the amorphous state can be stably maintained to a temperature as high as 800° C. or more. However, as the value m increases, in other words, the ratio of ZnO to InGaO$_3$ increases (that is, the composition of the film becomes closer to ZnO), the film comes to be easily crystallized For this reason, it is preferable that the value m is less than 6 when the amorphous film is used as the channel layer of an amorphous TFT.

A thin film transistor employing the transparent film mentioned above preferably uses a gate insulator formed of a mixed crystal compound containing one type of compound selected from the group consisting of Al$_2$O$_3$, Y$_2$O$_3$ and HfO$_2$ or a mixed crystal compound containing at least two types of compounds selected from the group consisting of Al$_2$O$_3$, Y$_2$O$_3$ and HfO$_2$. When a defect (deficiency) is present in the interface between the gate insulating thin film and the channel layer thin film, the electron mobility decreases and hysteresis as a transistor characteristic, takes place. Furthermore, if the types of gate insulators differs, leak current greatly varies. For this reason, it is necessary to select a suitable gate insulator for the channel layer. If an Al$_2$O$_3$ film is used (as the gate insulator), the leak current can be reduced. If an Y$_2$O$_3$ film is used, the hysteresis can be reduced. If an HfO$_2$ film having a high dielectric constant is used, the electron mobility can be increased. Furthermore, if a mixed crystal of these compounds is used (as a gate insulator), leak current, it is possible to form a TFT having a small leak current and hysteresis, and large electron mobility. Since a gate insulator formation process and a channel layer formation process can be performed at room temperature, not only a stagger-structure TFT but also an inverse-stagger structure TFT may be formed.

A TFT is a device having three terminals, namely, a gate terminal, source terminal and drain terminal. In the TFT, a semiconductor thin film formed on an insulating substrate such as ceramic, glass, or plastic substrate is used as a channel layer for migrating electrons and holes therethrough. The current flowing through the channel layer is controlled by applying a voltage to the gate terminal, thereby switching the current between the source terminal and the drain terminal. Since the TFT has such a switching function, it is an active device.

As described above, the second invention is directed to improvement of a composition in the film thickness direction of the transparent film, which serves as the active layer of a field effect transistor (FET), when the FET is formed using the transparent film.

To explain more specifically, when a pulse laser deposition method is used, a composition is changed in the film-thickness direction by varying oxygen partial pressure in the film thickness direction, varying oscillation power of a pulse laser or an oscillation frequency, or varying the distance between a target and a substrate in the film thickness direction. On the other hand, when a sputter deposition method is used, a composition is changed in the film thickness direction by additionally sputtering a target, such as In$_2$O$_3$ or ZnO. For example, when a film is formed under an oxygen atmosphere, the amount of oxygen contained in the film increases as the distance between a target and a substrate increases. Furthermore, when a ZnO target is added during film formation time, the amount of Zn increases in the film formed after the addition of the Zn target.

Third Embodiment: Amorphous Oxide Containing an Additive(s)

An amorphous oxide according to this embodiment is characterized in that the amorphous oxide contains at least one or plurality of types of elements selected from the group consisting of Li, Na, Mn, Ni, Pd, Cu, Cd, C, N, P, Ti, Zr, V, Ru, Ge, Sn, and F are contained as an additive. Introduction of an additive into an amorphous oxide is attained by introducing the additive in a gas for use in a film formation apparatus or in the film formation apparatus, or in a target material that is used in the apparatus. As a matter of course, after a film is formed from an amorphous oxide without an additive, the additive may be introduced into the film as is described later in Examples.

The electron carrier concentration of the amorphos oxide is preferably less than $10^{18}$/cm$^3$.

An amorphous oxide according to the present invention may include a transparent amorphous oxide comprising In—Ga—Zn—O and whose composition in a crystalline state is represented by InGaO$_3$(ZnO)$_m$ (m is a natural number of less than 6) and include an oxide comprising In—Ga—Zn—Mg—O and whose composition in a crystalline state is represented by InGaO$_3$(Zn$_{1-x}$Mg$_x$O)$_m$ (m is a natural number of less than 6, $0<x\leq1$). To these oxides, further at least one type or plurality of types of elements selected from the group consisting of Li, Na, Mn, Ni, Pd, Cu, Cd, C, N, and P are introduced as an additive.

In this manner, the electron carrier concentration can be reduced. Even though the electron carrier concentration is significantly reduced, it is possible to prevent the electron carrier mobility from decreasing, rendering the control of electron carrier concentration easy. As a result, when the transparent amorphous oxide film is employed as the channel layer of a TFT, the resultant TFT panel has a uniform characteristic even though the panel has a large area.

When Li, Na, Mn, Ni, Pd, Cu, Cd, C, N, and P, are used as an impurity (additive), these impurities can substitute for any one of In, Ga, Zn, O and serve as an acceptor and may decrease the electron carrier density, although the details of the mechanism are unknown. In a general oxide semiconductor, since the oxygen concentration cannot be appropriately controlled, a large number of oxygen deficiencies are produced. Furthermore, mostly in the case where deficiency are produced in the grain boundary due to a polycrystalline state, the electron carrier density cannot be controlled well even if impurities are introduced. In this respect, a transparent amorphous oxide film according to the present invention has a few oxygen deficiencies and no grain boundary due to the amorphous state. Hence, it is considered that impurities effectively work as the acceptor. When a thin film is formed by increasing oxygen partial pressure in order to reduce the electron carrier density, the skeleton of atomic bonding changes, increasing the tail state of the conduction band. If electrons are trapped by the tail state, the electron carrier mobility may substantially decrease. However, the addition of Li, Na, Mn, Ni, Pd, Cu, Cd, C, N, and P, makes it possible to control the carrier density while maintaining oxygen partial pressure within an appropriate range. Therefore, the electron carrier mobility is conceivably less affected. Thus, when the present invention is compared to the case where the electron carrier concentration and the electron carrier mobility are controlled only by controlling oxygen partial pressure, the in-plain uniformity of characteristics of an oxide film can be easily enhanced even though a large substrate is used.

The additive may be selected from the group consisting of Ti, Zr, V, Ru, Ge, Sn and F as mentioned below.

Note that the concentration of impurities required for obtaining a desired effect (in a amorphous film) is about 0.1 to 3 atomic %, which is higher than that in a crystalline film formed of Si or the like. This is considered because the probability that impurity atoms enter effective sites for controlling valence electrons is lower in the amorphous state than on the crystalline state. Most generally, a desired impurity is introduced into the target by an impurity introduction method. In the case of impurities such as C, N, and P, they can be introduced into a film by introducing a gas such as $CH_4$, NO and $PH_3$ together with oxygen to the atmosphere. When a metallic element is introduced as an impurity, after a transparent amorphous oxide film is formed, the film is brought into contact with a solution or paste containing the metallic-element ion. Furthermore, when a substrate such as a glass having a high heat resistance is used, these metallic elements are previously contained in the substrate and then, the substrate is heated during or after the film formation, thereby diffusing the metallic elements into a transparent amorphous oxide film. As a Na source, for example, soda glass can be used since it contains 10 to 20 atomic % of Na.

Figure 5:
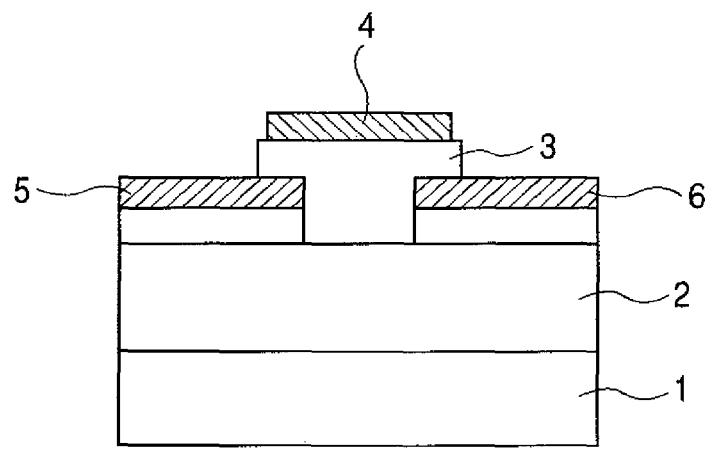
FIG. 5 is a schematic illustration showing the structure of a top-gate type metal insulator semiconductor field effect transistor (MISFET) device.

FIG. 5 shows a typical structure of a TFT device. In the TFT device, the portion that can effectively reduce the electron carrier density is that of a channel layer 2 sandwiched between a drain electrode 5 and a source electrode 6. In contrast, it is advantageous that the portion of the channel layer 2 in contact with the drain electrode 5 and the source electrode 6 has a high electron carrier density. This is because it can maintain good contact with the electrodes. In other words, the impurity concentration of this portion preferably low. Such a constitution can be attained by bringing the channel layer 2 into contact with a solution containing impurities after the drain electrode 5 and the source electrode 6 are formed and before a gate insulting film 3 is formed. In this manner, the impurities can be diffused with the drain electrode 5 and the source electrode 6 used as a mask.

In FIG. 5, the portion of the channel layer 2 especially in contact with the substrate is not easily placed under the control of the gate electrode 4 for electron carrier density. Therefore, it is helpful if the electron carrier density of the portion is previously suppressed low, in order to increase the on/off ratio. Then, it is effective to increase the concentration of impurities particularly at the interface facing the substrate. Such a constitution can be attained by controlling the concentration of a gas such as $CH_4$, NO and $PH_3$ to be introduced into the atmosphere, in such a manner that the gas is started to supply at an excessive concentration and gradually reduced in concentration. Alternatively, in the case of an impurity such as Na previously contained in a substrate, such a constitution can be attained by diffusing Na by heating the substrate at an appropriate temperature.

As an additive, at least one type or a plurality of types of elements selected from the group consisting of Ti, Zr, V, Ru, Ge, Sn, and F may be introduced into an amorphous oxide. In this case, it is expected that the electron mobility can be increased to 1 $cm^2/V \cdot sec$ or more, and further to 5 $cm^2/V \cdot sec$ or more while keeping an electron carrier concentration of less than $1 \times 10^{18}/cm^2$. Even if the electron field-effect mobility increases, the electron carrier concentration rarely increases in accordance therewith. Hence, when the transparent amorphous oxide film is used as the channel layer, it is possible to obtain a TFT having a high on/off ratio and a large saturation current during the pinch off time as well as a high switching speed. Furthermore, it is easy to enhance the in-plane uniformity of oxide-film characteristics even if a large substrate is used, compared to the case where the electron carrier concentration and the electron carrier mobility are controlled only by adjusting oxygen partial pressure.

Although details of the mechanism are unknown, when an oxide is formed by increasing the partial oxygen pressure, the tail state density of a portion under a conduction band increases, with the result that the mobility may decrease. However, impurities such as Ti, Zr, V, Ru, Ge, Sn, and F, conceivably act on the skeleton of atomic bonding, thereby reducing the tail state, with the result that the electron carrier mobility can be enhanced while maintaining the electron carrier density.

These impurities mentioned above are preferably used in a concentration within the range of about 0.1 to 3 atomic % or 0.01 to 1 atomic %. The term "atomic %" is a ratio of the atomic number of a constitutional element contained in an oxide. Note that when it is difficult to measure the amount of oxygen, the aforementioned ranges may be defined by a ratio of the atomic numbers of constitutional elements except for oxygen. Most generally, a desired impurity is introduced into the target by a method of introducing an impurity. In the case of an impurity of F, it can be introduced into a film by introducing a gas such as $SF_6$, $SiF_4$, or $CLF_3$ together with oxygen to the atmosphere. When a metallic element is introduced as the impurity, after a transparent amorphous oxide film is formed, the film is brought into contact with a solution or paste containing the metallic-element ion.

FIG. 5 shows a typical structure of a TFT device. In the TFT device, the portion in which especially high electron mobility is required, is that of the channel layer 2 in contact with the gate insulator 3. Then, it is effective that the impurity concentration of the present invention is increased particularly in the interface in contact with the gate insulation film 3. Such a constitution can be attained by introducing a gas such as $SF_6$, $SiF_4$, and $CLF_3$ into an atmosphere during the channel layer formation time while increasing the concentration of the gas (starting from a lower level).

In the present invention, it is basically important that atomic bonding structure can be appropriately formed by controlling the amount of oxygen (oxygen defect amount).

In the aforementioned description, the amount of oxygen in a transparent oxide film is controlled by forming a film in an atmosphere containing a predetermined amount of oxygen. It is also preferable that after an oxide film is formed, it is treated in an atmosphere containing oxygen, thereby controlling (decreasing or increasing) the oxygen defect amount.

To effectively control the oxygen defect amount, a film is treated in an atmosphere containing oxygen set at a temperature from 0 to 300° C. (both inclusive), preferably from 25 to 250° C. (both inclusive), further preferable 100 to 200° C. (both inclusive).

As a matter of course, not only film formation but also treatment after the film formation may be performed in an atmosphere containing oxygen. Furthermore, as long as a predetermined electron carrier concentration (less than $1 \times 10^{18}/cm^3$) is obtained, a film may be formed without controlling oxygen partial pressure and thereafter the film may be treated in an atmosphere containing oxygen.

In the present invention, the lowermost electron carrier concentration varies depending upon the use of the obtained oxide film, more specifically, the type of device, circuit, and apparatus; however, for example, $1 \times 10^{14}/cm^3$ or more is preferable.

Now, amorphous oxides applicable to Embodiments 1 to 3 will be described in detail below. To the amorphous oxides or the manufacturing methods thereof, the following conditions are added. In the invention according to the first embodiment, light irradiation is added to the manufacturing conditions. In the invention according to the second embodiment, means for changing a film composition are used as described in Examples. In the invention according to the third embodiment, in addition to the film formation conditions, a gas and a target for adding impurities are used or, after the film formation, a predetermined method for adding impurities to amorphous oxide shown below may be employed.

(Amorphous Oxide)

The active layer employed in the above Embodiments 1 to 3 of the invention is explained below.

The electron carrier concentration in the amorphous oxide in the present invention is a value measured at a room temperature. The room temperature is a temperature in the range from 0° C. to about 40° C., for example, 25° C. The electron carrier concentration in the amorphous oxide in the present invention need not be less than $10^{18}/cm^3$ throughout the entire range from 0 to 40° C. For example, the electron carrier concentration of less than $1 \times 10^{18}/cm^3$ at a temperature of 25° C. is acceptable. At a lower electron carrier concentration, not more than $1 \times 10^{17}/cm^3$, or not more than $1 \times 10^{16}/cm^3$, a normally-off TFT can be produced at a high yield.

In the present specification, the description "less than $10^{18}/cm^3$" means—preferably less than $1 \times 10^{18}/cm^3$ and more preferably less than $1.0 \times 10^{18}/cm^3$–.

The electron carrier concentration can be measured by measurement of a Hall Effect.

The amorphous oxide in the present invention is an oxide which exhibits a halo pattern and no characteristic diffraction line in an X-ray diffraction spectrometry.

In the amorphous oxide of the present invention, the lower limit of the electron carrier concentration is, for example, $1 \times 10^{12}/cm^3$, but is not limited insofar as it is applicable as a channel layer of a TFT.

Accordingly, in the present invention, the electron carrier concentration is adjusted by controlling the material, composition ratio, production conditions, and so forth of the amorphous oxide as in the Examples described later to be in the range, for instance, from $1 \times 10^{12}/cm^3$ to $1 \times 10^{18}/cm^3$, preferably from $1 \times 10^{13}/cm^3$ to $1 \times 10^{17}/cm^3$, more preferably from $1 \times 10^{15}/cm^3$ to $1 \times 10^{16}/cm^3$.

The amorphous oxide, other than the InZnGa oxides, can be selected suitably from In oxides, $In_xZn_{1-x}$ oxides ($0.2 \leq x \leq 1$), $In_xSn_{1-x}$ oxides ($0.8 \leq x \leq 1$), and $In_x(Zn,Sn)_{1-x}$ oxides ($0.15 \leq x \leq 1$). The $In_x(Zn,Sn)_{1-x}$ oxide can also be represented by $In_x(Zn_ySn_{1-y})_{1-x}$ ($0 \leq x \leq 1$).

When the In oxide contains neither Zn nor Sn, the In can be partly substituted by Ga: $In_xGa_{1-x}$ oxide ($0 \leq x \leq 1$).

An amorphous oxide of an electron carrier concentration of $1 \times 10^{18}/cm^3$ which is prepared by the inventors of the present invention is described below in detail.

One group of the aforementioned oxides are characteristically constituted of In—Ga—Zn—O, represented by $InGaO_3(ZnO)_m$ (m: a natural number of less than 6) in a crystal state, and containing electron carriers at a concentration of less than $1 \times 10^{18}/cm^3$.

The other group of the aforementioned oxides are characteristically constituted of In—Ga—Zn—Mg—O, represented by $InGaO_3(Zn_{1-x}Mg_xO)_m$ (m: a natural number of less than 6, and $0 < x \cdot 1$) in a crystal state, and containing electron carriers at a concentration of less than $1 \times 10^{18}/cm^3$.

The film constituted of such an oxide is preferably designed to exhibit preferably an electron mobility of higher than 1 cm²/V·sec.

By use of the above film as the channel layer, a TFT can be prepared which is normally-off with a gate current of less than 0.1 microampere in a transistor off-state, having an on-off ratio of higher than $1 \times 10^3$, being transparent to visible light and flexible.

In the above film, the electron mobility increases with the increase of the conduction electrons. The substrate for forming the transparent film includes glass plates, plastic plates, and plastic films.

In using the above amorphous oxide film as the channel layer, at least one of layers constituted of $Al_2O_3$, $Y_2O_3$ or $HfO_2$, or a mixed crystal compound thereof is useful as the gate insulator.

In a preferred embodiment, the film is formed in an oxygen gas-containing atmosphere without intentional addition of an impurity for increasing the electric resistance to the amorphous oxide.

The inventors of the present invention found that the amorphous thin films of semi-insulating oxides have characteristics that the electron mobility therein increases with increase in number of conduction electrons, and further found that a TFT prepared by use of the film is improved in transistor characteristics such as the on-off ratio, the saturation current in a pinch-off state, and the switching rate. Thus a normally-off type TFT can be produced by use of the amorphous oxide.

By use of the amorphous oxide thin film as the channel layer of a film transistor, the electron mobility can be made higher than 1 cm$^2$/V·sec, preferably higher than 5 cm$^2$/V·sec. The current between the drain terminal and the source terminal at an off-state (no gate voltage applied) can be controlled to be less than 10 microamperes, preferably less than more than 0.1 microamperes at the carrier concentration of lower than $1 \times 10^{18}$/cm$^3$, preferably lower than $1 \times 10^{16}$/cm$^3$. Further by use of this thin film, the saturation current after pinch-off can be raised to 10 microamperes or more and the on-off ratio can be raised to be higher than $1 \times 10^3$ for the electron mobility higher than 1 cm$^2$/V·sec, preferably higher than 5 cm$^2$/V·sec.

In a pinch-off state of the TFT, a high voltage is being applied to the gate terminal, and electrons are existing in a high density in the channel. Therefore, according to the present invention, the saturation current can be increased in correspondence with the increase of the electron mobility. Thereby, the transistor characteristics can be improved, such as increase of the on-off ratio, increase of the saturation current, and increase of the switching rate. In contrast, in a usual compound, the increase of electrons decreases the electron mobility owing to collision between electrons.

The structure of the aforementioned TFT may be a stagger (top gate) structure in which a gate insulator and a gate terminal are successively formed on a semiconductor channel layer, or a reversed stagger (bottom gate) structure in which a gate insulator and a semiconductor channel layer successively on a gate terminal.

(First Process for Film Formation: PLD Process)

The amorphous oxide thin film having the composition InGaO$_3$(ZnO)$_m$ (m: a natural number of less than 6) in a crystal state is stable up to a high temperature of 800° C. or higher when m is less than 6, whereas with increase of m, namely with increase of the ratio of ZnO to InGaO$_3$ near to the composition of ZnO, the oxide tends to crystallize. Therefore, the value m of the oxide is preferably less than 6 for use as the channel layer of the amorphous TFT.

The film formation is conducted preferably by a gas phase film formation process by use of a target of a polycrystalline sintered compact having a composition InGaO$_3$(ZnO)$_m$. Of the gas phase film formation processes, sputtering, and pulse laser vapor deposition are suitable. The sputtering is particularly suitable for the mass-production.

However, in formation of the amorphous film under usual conditions, oxygen defect can occur, so that the electron carrier concentration of less than $1 \times 10^{18}$/cm$^3$ and electric conductivity of less the 10 S/cm cannot be achieved. With such a film, a normally-off transistor cannot be constituted.

The inventors of the present invention produced an In—Ga—Zn—O film by a pulse laser vapor deposition by use of the apparatus shown in FIG. 7.

The film-forming was carried out by using such a PLD film-forming apparatus as shown in FIG. 7.

In FIG. 7, the numerals indicate the followings: 701, an RP (rotary pump); 702, a TMP (turbo molecular pump); 703, a preliminary chamber; 704, an electron gun for RHEED; 705, a substrate-holding means for rotating and vertically moving the substrate; 706, a laser-introducing window; 707, a substrate; 708, a target; 709, a radical source; 710, a gas inlet; 711, a target-holding means for rotating and vertically moving the target; 712, a by-pass line; 713, a main line; 714, a TMP (turbo molecular pump); 715, an RP (rotary pump); 716, a titanium getter pump; 717, a shutter; 718, an IG (ion manometer); 719, a PG (Pirani gage); 720, a BG (baratron gage); and 721, a growth chamber.

An In—Ga—Zn—O type amorphous oxide semiconductor thin film was deposited on an SiO$_2$ glass substrate (Corning Co.: 1737) by a pulse laser vapor deposition employing a KrF excimer laser. As the pretreatment before the deposition, the substrate was washed ultrasonically for defatting with acetone, ethanol, and ultrapure water each for five minutes, and dried in the air at 100° C.

The polycrystalline target was an InGaO$_3$(ZnO)$_4$ sintered compact (size: 20 mm diameter, 5 mm thick), which had been prepared by wet-mixing In$_2$O$_3$, Ga$_2$O$_3$, and ZnO (each 4N reagent) as the source material (solvent: ethanol), calcining the mixture (1000° C., 2 hours), dry-crushing it, and sintering it (1550° C., 2 hours). The target had an electro conductivity of 90 S/cm.

The film formation was conducted by controlling the final vacuum of the growth chamber to be $2 \times 10^{-6}$ Pa, and the oxygen partial pressure during the growth to be 6.5 Pa. The oxygen partial pressure in growth chamber 721 was 6.5 Pa, and the substrate temperature was 25° C. The distance between target 708 and film-holding substrate 707 was 30 mm, the power introduced through introduction window 716 was in the range of 1.5-3 mJ/cm$^2$/pulse. The pulse width was 20 nsec, the repeating frequency was 10 Hz, and the irradiation spot size was 1×1 mm square. Under the above conditions, the film was formed at a rate of 7 nm/min.

The resulting thin film was examined by small angle X-ray scattering method (SAXS) (thin film method, incidence angle: 0.5°): no clear diffraction peak was observed. Thus the obtained In—Ga—Zn—O type thin film was judged to be amorphous. From X-ray reflectivity and its pattern analysis, the mean square roughness (Rrms) was found to be about 0.5 nm, and the film thickness to be about 120 nm. From fluorescence X-ray spectrometric analysis (XRF), the metal composition of the film was found to be In:Ga:Zn=0.98:1.02:4. The electric conductivity was less than about $1 \times 10^{-2}$ S/cm. The electron carrier concentration was estimated to be not more than $1 \times 10^{-16}$/cm$^2$. The electron mobility was estimated to be about 5 cm$^2$/V·sec. From light absorption spectrum analysis, the optical band gap energy breadth of the resulting amorphous thin film was estimated to be about 3 eV.

The above results show that the obtained In—Ga—Zn—O type thin film is a transparent flat thin film having an amorphous phase of a composition near to a crystalline InGaO$_3$(ZnO)$_4$, having less oxygen defect, and having lower electric conductivity.

The above film formation is explained specifically by reference to FIG. 1. FIG. 1 shows dependency of the electron carrier concentration in the formed transparent amorphous oxide thin film on the oxygen partial pressure for the film of a composition of InGaO$_3$(ZnO)$_m$ (m: an integer less than 6) in an assumed crystalline state under the same film formation conditions as in the above Example.

By formation of the film in an atmosphere having an oxygen partial pressure of higher than 4.5 Pa under the same conditions as in the above Example, the electron carrier concentration could be lowered to less than $1 \times 10^{18}$/cm$^3$ as shown in FIG. 1. In this film formation, the substrate was kept nearly at room temperature without intentional heating. For use of a flexible plastic film as the substrate, the substrate temperature is kept preferably at a temperature lower than 100° C.

The higher oxygen partial pressure enables decrease of the electron carrier concentration. For instance, as shown in FIG. 1, the thin InGaO$_3$(ZnO)$_4$ film formed at the substrate temperature of 25° C. and the oxygen partial pressure of 5 Pa had a lower electron carrier concentration of $1\times10^{16}/cm^3$.

Figure 2:
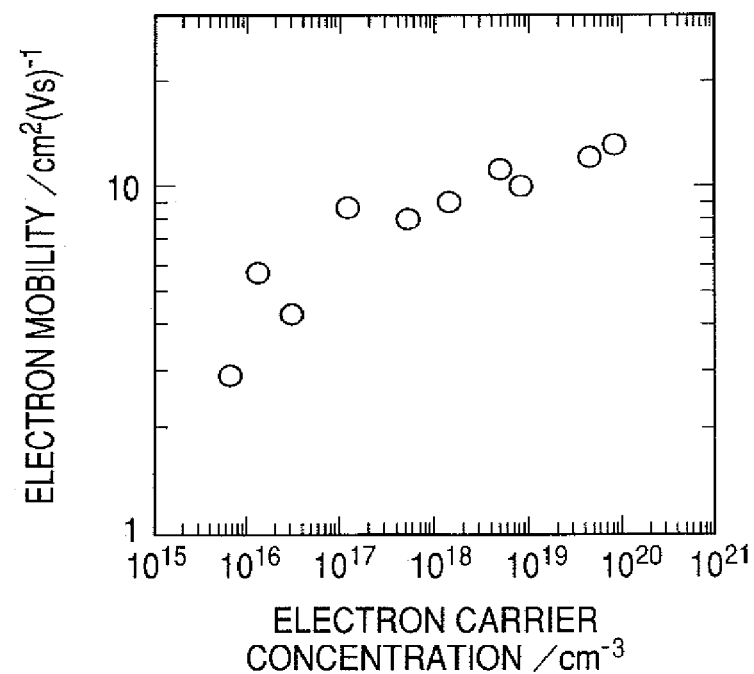
FIG. 2 is a graph showing the relationship between the electric conductivity of an In—Ga—Zn—O based amorphous film formed by a sputtering method using argon gas and the oxygen partial pressure during film formation time.

In the obtained thin film, the electron mobility was higher than 1 cm$^2$/V·sec as shown in FIG. 2. However, the film deposited by the pulse laser vapor deposition at an oxygen partial pressure of higher than 6.5 Pa as in this Example has a rough surface, being not suitable for a channel layer of the TFT.

Accordingly, a normally-off type transistor can be constructed by using a transparent thin amorphous oxide represented by InGaO$_3$(ZnO)$_m$ (m: a number less than 6) in a crystal state formed at an oxygen partial pressure of higher than 4.5 Pa, preferably higher than 5 Pa, but lower than 6.5 Pa by a pulse laser vapor deposition method in the above Example. The above obtained thin film exhibited an electron mobility higher than 1 cm$^2$/V, and the on-off ratio could be made higher than $1\times10^3$.

As described above, in formation of an InGaZn oxide film by a PLD method under the conditions shown in this Example, the oxygen partial pressure is controlled in the range preferably from 4.5 Pa to 6.5 Pa.

For achieving the electron carrier concentration of $1\times10^{18}/cm^3$, the oxygen partial pressure conditions, the constitution of the film formation apparatus, the kind and composition of the film-forming material should be controlled.

Next, a top-gate type MISFET element as shown in FIG. 5 was produced by forming an amorphous oxide with the aforementioned apparatus at an oxygen partial pressure of 6.5 Pa. Specifically, on glass substrate 1, a semi-insulating amorphous InGaO$_3$(ZnO)$_4$ film of 120 nm thick was formed for use for channel layer 2 by the above method of formation of amorphous thin Ga—Ga—Zn—O film. Further thereon an InGaO$_3$(ZnO)$_4$ film having a higher electro conductivity and a gold film were laminated respectively in a thickness of 30 nm by pulse laser deposition at an oxygen partial pressure of lower than 1 Pa in the chamber. Then drain terminal 5 and source terminal 6 were formed by photolithography and a lift-off method. Finally, a Y$_2$O$_3$ film for gate insulator 3 was formed by an electron beam vapor deposition method (thickness: 90 nm, relative dielectric constant: about 15, leak current density: $1\times10^{-3}$ A/cm$^3$ at application of 0.5 MV/cm). Thereon, a gold film was formed, and gate terminal 4 was formed by photolithography and lifting-off.

Evaluation of Characteristics of MISFET Element

Figure 6:
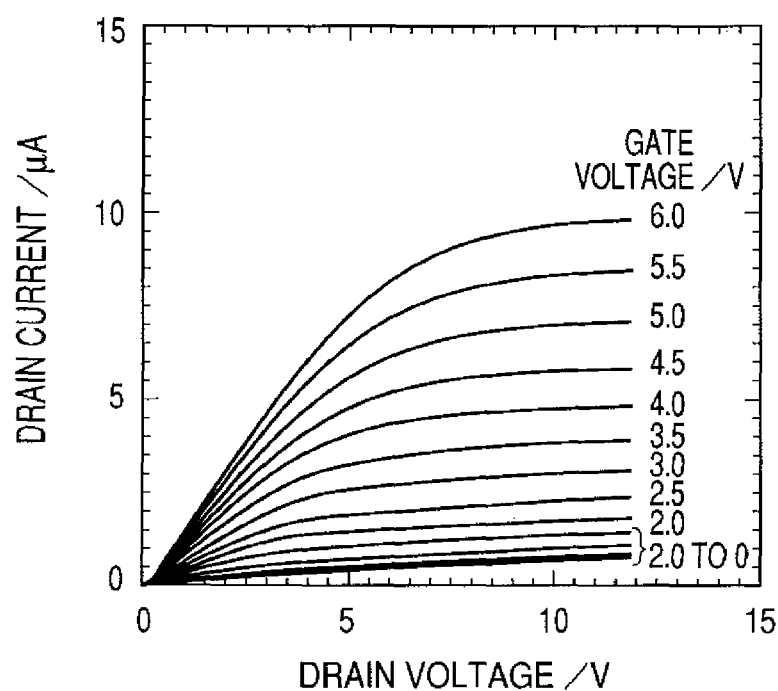
FIG. 6 is a characteristic graph showing the electric current versus voltage of a top-gate type MISFET device.

FIG. 6 shows current-voltage characteristics of the MISFET element measured at room temperature. The channel is understood to be an n-type semiconductor from the increase of the drain current I$_{DS}$ with the increase of the drain voltage V$_{DS}$. This is consistent with the fact that an amorphous In—Ga—Zn—O type semiconductor is of an n-type. The I$_{DS}$ becomes saturated (pinched off) at V$_{DS}$=6V, which is typical behavior of a semiconductor transistor. From examination of the gain characteristics, the threshold value of the gate voltage V$_{DS}$ under application of V$_{DS}$=4V was found to be about −0.5 V. A current flow of I$_{DS}$=1.0×10$^{-5}$ A was caused at V$_G$=10V. This corresponds to carrier induction by gate bias in the In—Ga—Zn—O type amorphous semiconductor thin film.

The on-off ratio of the transistor was higher than $1\times10^3$. From the output characteristics, the field effect mobility was calculated to be about 7 cm$^2$(Vs)$^{-1}$. Irradiation of visible light did not change the transistor characteristics of the produced element according to the same measurement.

According to the present invention, a thin film transistor can be produced which has a channel layer containing electron carriers at a lower concentration to achieve higher electric resistance and exhibiting a higher electron mobility.

The above amorphous oxide has excellent characteristics that the electron mobility increases with the increase of the electron carrier concentration, and exhibits degenerate conduction. In this Example, the thin film was formed on a glass substrate. However, a plastic plate or film is useful as the substrate since the film formation can be conducted at room temperature. Further, the amorphous oxide obtained in this Example, absorbs visible light only little to give transparent flexible TFT.

(Second Process for Film Formation: Sputtering Process (SP Process))

Film formation by a high-frequency SP process by use of an argon gas as the atmosphere gas is explained below.

The SP process was conducted by use of the apparatus shown in FIG. 8. In FIG. 8, the numerals indicates the followings: 807, a substrate for film formation; 808, a target; 805, a substrate-holding means equipped with a cooling mechanism; 814, a turbo molecular pump; 815, a rotary pump; 817, a shutter; 818, an ion manometer; 819, a Pirani gage; 821, a growth chamber; and 830, a gate valve.

Substrate 807 for film formation was an SiO$_2$ glass substrate (Corning Co.: 1737) which had been washed ultrasonically for defatting with acetone, ethanol, and ultrapure water respectively for 5 minutes, and dried at 100° C. in the air.

The target was a polycrystalline sintered compact having a composition of InGaO$_3$(ZnO)$_4$ (size: 20 nm diameter, 5 mm thick), which had been prepared by wet-mixing In$_2$O$_3$, Ga$_2$O$_3$, and ZnO (each 4N reagent) as the source material (solvent: ethanol), calcining the mixture (1000° C., 2 hours), dry-crushing it, and sintering (1550° C., 2 hours). Target 808 had an electro conductivity of 90 S/cm, being semi-insulating.

The final vacuum degree of growth chamber 821 was $1\times10^{-4}$ Pa. During the growth, the total pressure of the oxygen and argon gas was kept constant within the range of 4 to 0.1×10$^{-1}$ Pa. The partial pressure ratio of argon to oxygen was changed in the range of the oxygen partial pressure from $1\times10^{-3}$ to $2\times10^{-1}$ Pa.

The substrate temperature was room temperature. The distance between target 808 and substrate 807 for film formation was 30 mm.

The inputted electric power was RF 180 W, and the film forming rate was 10 nm/min.

The resulting thin film was examined by small angle X-ray scattering method (SAXS) (thin film method, incidence angle: 0.5°): no clear diffraction peak was observed. Thus the obtained In—Ga—Zn—O type thin film was judged to be amorphous. From X-ray reflectivity and its pattern analysis, the mean square roughness (Rrms) was found to be about 0.5 nm, and the film thickness to be about 120 nm. From fluorescence X-ray spectrometric analysis (XRF), the metal composition of the film was found to be In:Ga:Zn=0.98:1.02:4.

Figure 3:
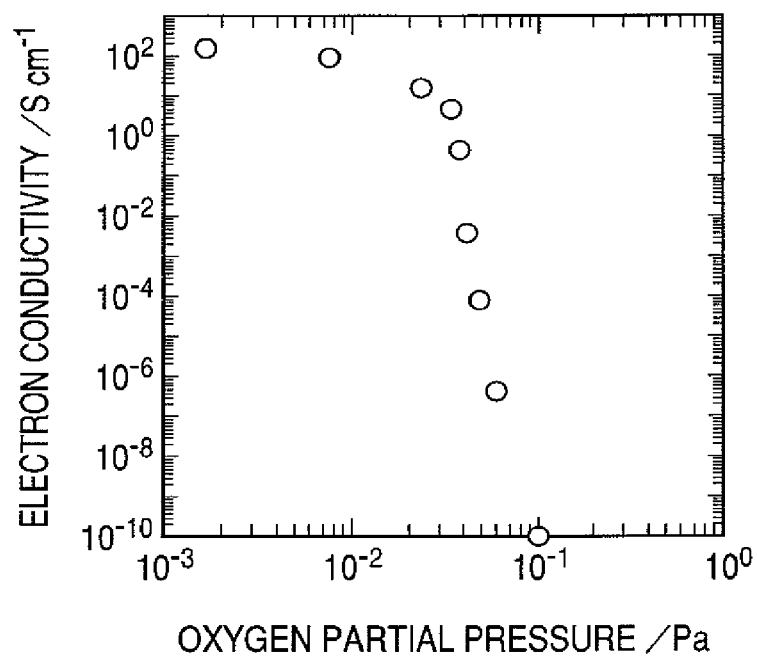
FIG. 3 is a graph showing the relationship between the number of electron carriers of an In—Ga—Zn—C based amorphous film formed by a pulse laser deposition method and the electron mobility.

The films were formed at various oxygen partial pressure of the atmosphere, and the resulting amorphous oxide films were measured for electric conductivity. FIG. 3 shows the result.

As shown in FIG. 3, the electric conductivity can be lowered to less than 10 S/cm by conducting the film formation in an atmosphere having an oxygen partial pressure higher then 3×10$^{-2}$ Pa. The electron carrier number could be decreased by increase of the oxygen partial pressure.

As shown in FIG. 3, for instance, the thin InGaO$_3$(ZnO)$_4$ film formed at the substrate temperature of 25° C. and the oxygen partial pressure or $1 \times 10^{-1}$ Pa had a lower electric conductivity of about $1 \times 10^{-10}$ S/cm. Further, the thin InGaO$_3$(ZnO)$_4$ film formed at the oxygen partial pressure of $1 \times 10^{-1}$ Pa had an excessively high electric resistance, having the electric conductivity not measurable. With this film, although the electron mobility was not measurable, the electron mobility was estimated to be about 1 cm$^2$/V·sec by extrapolation from the values of the films of high electron carrier concentration.

Thus, a normally-off transistor having the on-off ratio of higher than $1 \times 10^3$ could be obtained by use of a transparent thin amorphous oxide film constituted of In—Ga—Zn—O represented in a crystal state by InGaO$_3$(ZnO)$_m$ (m: a natural number of less than 6) produced by sputtering vapor deposition in an argon atmosphere containing oxygen at a partial pressure of higher than $3 \times 10^{-2}$ Pa, preferably higher than $5 \times 10^{-1}$ Pa.

In use of the apparatus and the material employed in this Example, the film formation by sputtering is conducted in the oxygen partial pressure ranging from $3 \times 10^{-2}$ Pa to $5 \times 10^{-1}$ Pa. Incidentally, in the thin film produced by pulse laser vapor deposition or sputtering, the electron mobility increases with increase in number of the conductive electrons.

As described above, by controlling the oxygen partial pressure, the oxygen defect can be decreased, and thereby the electron carrier concentration can be decreased. In the amorphous thin film, the electron mobility can be high, since no grain interface exists essentially in the amorphous state differently from polycrystalline state.

Incidentally, the substitution of the glass substrate by a 200 μm-thick polyethylene terephthalate (PET) film did not change the properties of the amorphous oxide film of InGaO$_3$(ZnO)$_4$ formed thereon.

A high-resistance amorphous film InGaO$_3$(Zn$_{1-x}$Mg$_x$O)$_m$ (m: an natural number less than 6; 0<x·1) can be obtained by using, as the target, polycrystalline InGaO$_3$(Zn$_{1-x}$Mg$_x$O)$_m$ even at an oxygen partial pressure less than 1 Pa. For instance, with a target in which 80 atom % of Zn is replaced by Mg, the electron carrier concentration lower than $1 \times 10^{16}$/cm (resistance: about $1 \times 10^{-2}$ S/cm) can be achieved by pulse laser deposition in an atmosphere containing oxygen at a partial pressure of 0.8 Pa. In such a film, the electron mobility is lower than that of the Mg-free film, but the decrease is slight: the electron mobility is about 5 cm$^2$/V·sec at room temperature, being higher by about one digit than that of amorphous silicon. When the films are formed under the same conditions, increase of the Mg content decreases both the electric conductivity and the electron mobility. Therefore, the content of the Mg ranges preferably from 20% to 85% (0.2<x<0.85).

In the thin film transistor employing the above amorphous oxide film, the gate insulator contains preferably a mixed crystal compound containing two or more of Al$_2$O$_3$, Y$_2$O$_3$, HfO$_2$, and compounds thereof.

The presence of a defect at the interface between the gate-insulating thin film and the channel layer thin film lowers the electron mobility and causes hysteresis of the transistor characteristics. Moreover, the current leakage depends greatly on the kind of the gate insulator. Therefore the gate insulator should be selected to be suitable for the channel layer. The current leakage can be decreased by use of an Al$_2$O$_3$ film, the hysteresis can be made smaller by use of a Y$_2$O$_3$ film, and the electron mobility can be increased by use of an HfO$_2$ film having a high dielectric constant. By use of the mixed crystal of the above compounds, TFT can be formed which causes smaller current leakage, less hysteresis, and exhibiting a higher electron mobility. Since the gate insulator forming process and the channel layer forming process can be conducted at room temperature, the TFT can be formed in a stagger constitution or in a reversed stagger constitution.

The TFT thus formed is a three-terminal element having a gate terminal, a source terminal, and a drain terminal. This TFT is formed by forming a semiconductor thin film on a insulating substrate of a ceramics, glass, or plastics as a channel layer for transport of electrons or holes, and serves as an active element having a function of controlling the current flowing through the channel layer by application of a voltage to the gate terminal, and switching the current between the source terminal and the drain terminal.

In the present invention, it is important that an intended electron carrier concentration is achieved by controlling the amount of the oxygen defect.

In the above description, the amount of the oxygen in the amorphous oxide film is controlled by controlling the oxygen concentration in the film-forming atmosphere. Otherwise the oxygen defect quantity can be controlled (decreased or increase) by post-treatment of the oxide film in an oxygen-containing atmosphere as a preferred embodiment.

For effective control of the oxygen defect quantity, the temperature of the oxygen-containing atmosphere is controlled in the range from 0° C. to 300° C., preferably from 25° C. to 250° C., more preferably from 100° C. to 200° C.

Naturally, a film may be formed in an oxygen-containing atmosphere and further post-treated in an oxygen-containing atmosphere. Otherwise the film is formed without control of the oxygen partial pressure and post-treatment is conducted in an oxygen-containing atmosphere, insofar as the intended electron carrier concentration (less than $1 \times 10^{18}$/cm$^3$) can be achieved.

The lower limit of the electron carrier concentration in the present invention is, for example, $1 \times 10^{14}$/cm % depending on the kind of the element, circuit, or device employing the produced oxide film.

(Broader Range of Materials)

After investigation on other materials for the system, it was found that an amorphous oxide composed of at least one oxide of the elements of Zn, In, and Sn is useful for an amorphous oxide film of a low carrier concentration and high electron mobility.

This amorphous oxide film was found to have a specific property that increase in number of conductive electrons therein increases the electron mobility. Using this film, a normally-off type TFT can be produced which is excellent in transistor properties such as the on-off ratio, the saturation current in the pinch-off state, and the switching rate.

In the present invention, an oxide having any one of the characteristics of (a) to (h) below are useful:

(a) An amorphous oxide which has an electron carrier concentration less than $1 \times 10^{18}$/cm$^2$;

(b) An amorphous oxide in which the electron mobility becomes increased with increase of the electron carrier concentration;

(The room temperature signifies a temperature in the range from about 0° C. to about 40° C. The term "amorphous compound" signifies a compound which shows a halo pattern only without showing a characteristic diffraction pattern in X-ray diffraction spectrum. The electron mobility signifies the one measured by the Hall effect.)

(c) An amorphous oxide mentioned in the above items (a) or (b), in which the electron mobility at room temperature is higher than 0.1 cm$^2$/V·sec;

(d) An amorphous oxide mentioned, in any of the items (b) to (c), which shows degenerate conduction; (The term "degenerate conduction" signifies the state in which the thermal activation energy in temperature dependency of the electric resistance is not higher than 30 meV.)

(e) An amorphous oxide, mentioned in any of the above item (a) to (d), which contains at least one of the elements of Zn, In, and Sn as the constituting element;

(f) An amorphous oxide film composed of the amorphous oxide mentioned the above item (e), and additionally at least one of the elements of Group-2 elements M2 having an atomic number lower than Zn (Mg, and Ca), Group-3 elements M3 having an atomic number lower than In (B, Al, Ga, and Y), Group-4 elements M4 having an atomic number lower than Sn (Si, Ge, and Zr), Group-5 elements M5 (V, Nb, and Ta), and Lu, and W to lower the electron carrier concentration;

(g) An amorphous oxide film, mentioned in any of the above items (a) to (f), constituted of a single compound having a composition of $In_{1-x}M3_xO_3(Zn_{1-y}M2_yO)_m$ ($0 \leq x \leq 1$; $0 \leq y \leq 1$; m: 0 or a natural number of less than 6) in a crystal state, or a mixture of the compounds different in number m, an example of M3 being Ga, and an example of M2 being Mg; and (h) An amorphous oxide film, mentioned in any of the above items (a) to (g) formed on a plastic substrate or an plastic film.

The present invention also provides a field-effect transistor employing the above mentioned amorphous oxide or amorphous oxide film as the channel layer.

A field-effect transistor is prepared which is employs an amorphous oxide film having an electron carrier concentration of less than $1 \times 10^{18}/cm^3$ but more than $1 \times 10^{15}/cm^3$ as the channel layer, and having a source terminal and a drain terminal, and a gate terminal with interposition of a gate insulator. When a voltage of about 5 V is applied between the source and drain terminals without application of gate voltage, the electric current between the source and drain terminals is about $1 \times 10^{-7}$ amperes.

The electron mobility in the oxide crystal becomes larger with increase of the overlap of the s-orbitals of the metal ions. In an oxide crystal of Zn, In, or Sn having a higher atomic number, the electron mobility is in the range from 0.1 to 200 $cm^2/V \cdot sec$.

In an oxide, oxygen and metal ions are bonded by ionic bonds without orientation of the chemical bonds, having a random structure. Therefore in the oxide in an amorphous state, the electron mobility can be comparable to that in a crystal state.

On the other hand, substitution of the Zn, In, or Sn with an element of a lower atomic number decreases the electron mobility. Thereby the electron mobility in the amorphous oxide of the present invention ranges from about 0.01 to 20 $cm^2/V \cdot sec$.

In the transistor having a channel layer constituted of the above oxide, the gate insulator is preferably formed from $Al_2O_3$, $Y_2O_3$, $HfO_2$, or a mixed crystal compound containing two or more thereof.

The presence of a defect at the interface between the gate-insulating thin film and the thin channel layer film lowers the electron mobility and causes hysteresis of the transistor characteristics. Moreover, the current leakage depends greatly on the kind of the gate insulator. Therefore the gate insulator should be selected to be suitable for the channel layer. The current leakage can be decreased by use of an $Al_2O_3$ film, the hysteresis can be made smaller by use of a $Y_2O_3$ film, and the electron mobility can be increased by use of an $HfO_2$ film having a high dielectric constant. By use of the mixed crystal of the above compounds, TFT can be formed which causes smaller current leakage, less hysteresis, and exhibiting a higher electron mobility. Since the gate insulator-forming process and the channel layer-forming process can be conducted at room temperature, the TFT can be formed in a stagger constitution or in a reversed stagger constitution.

The $In_2O_3$ oxide film can be formed through a gas-phase process, and addition of moisture in a partial pressure of about 0.1 Pa to the film-forming atmosphere makes the formed film amorphous.

ZnO and $SnO_2$ respectively cannot readily be formed in an amorphous film state. For formation of the ZnO film in an amorphous state, $In_2O_3$ is added in an amount of 20 atom %. For formation of the $SnO_2$ film in an amorphous state, $In_2O_3$ is added in an amount of 90 atom %. In formation of Sn—In—O type amorphous film, gaseous nitrogen is introduced in a partial pressure of about 0.1 Pa in the film formation atmosphere.

To the above amorphous film, may be added an element capable of forming a complex oxide, selected from Group-2 elements M2 having an atomic number lower than Zn (Mg, and Ca), Group-3 elements M3 having an atomic number lower than In (B, Al, Ga, and Y), Group-4 elements M4 having an atomic number lower than Sn (Si, Ge, and Zr), Group-5 elements M5 (V, Nb, and Ta), and Lu, and W. The addition of the above element stabilizes the amorphous film at room temperature, and broadens the composition range for amorphous film formation.

In particular, addition of B, Si, or Ge tending to form a covalent bond is effective for amorphous phase stabilization. Addition of a complex oxide constituted of ions having largely different ion radiuses is effective for amorphous phase stabilization. For instance, in an In—Zn—O system, for formation of a film stable at room temperature, In should be contained more than about 20 atom %. However, addition of Mg in an amount equivalent to In enables formation of stable amorphous film in the composition range of In of not less than about 15 atom %.

In a gas-phase film formation, an amorphous oxide film of the electron carrier concentration ranging from $1 \times 10^{15}/cm^3$ to $1 \times 10^{18}/cm^3$ can be obtained by controlling the film forming atmosphere.

An amorphous oxide film can be suitably formed by a vapor phase process such as a pulse laser vapor deposition process (PLD process), a sputtering process (SP process), and an electron-beam vapor deposition. Of the vapor phase processes, the PLD process is suitable in view of ease of material composition control, whereas the SP process is suitable in view of the mass production. However, the film-forming process is not limited thereto.

(Formation of In—Zn—Ga—O Type Amorphous Oxide Film by PLD Process)

An In—Zn—Ga—O type amorphous oxide was deposited on a glass substrate (Corning Co.: 1737) by a PLD process employing a KrF excimer laser with a polycrystal sintered compact as the target having a composition of $InGaO_3(ZnO)$ or $InGaO_3(ZnO)_4$.

The apparatus shown in FIG. 7 was employed which is mentioned before, and the film formation conditions were the same as mentioned before for the apparatus.

The substrate temperature was 25° C.

The resulting two thin films were examined by small angle X-ray scattering method (SAXS) (thin film method, incidence angle: 0.5°): no clear diffraction peak was observed, which shows that the obtained In—Ga—Zn—O type thin films produced with two different targets were both amorphous.

From X-ray reflectivity of the In—Zn—Ga—O type amorphous oxide film of the glass substrate and its pattern analysis, the mean square roughnesses (Rrms) of the thin films were found to be about 0.5 nm, and the film thicknesses to be about 120 nm. From fluorescence X-ray spectrometric analysis (XRF), the film obtained with the target of the polycrystalline sintered compact of InGaO$_3$(ZnO) was found to contain the metals at a composition ratio In:Ga: Zn=1.1:1.1:0.9, whereas the film obtained with the target of the polycrystalline sintered compact of InGaO$_3$(ZnO)$_4$ was found to contain the metals at a composition ratio In:Ga: Zn=0.98:1.02:4.

Amorphous oxide films were formed at various oxygen partial pressure of the film-forming atmosphere with the target having the composition of InGaO$_3$(ZnO)$_4$. The formed amorphous oxide films were measured for the electron carrier concentration. FIG. 1 shows the results. By formation of the film in an atmosphere having an oxygen partial pressure of higher than 4.2 Pa, the electron carrier concentration could be lowered to less than $1\times10^{18}$/cm$^3$ as shown in FIG. 1. In this film formation, the substrate was kept nearly at room temperature without intentional heating. At the oxygen partial pressure of lower than 6.5 Pa, the surfaces of the obtained amorphous oxide films were flat.

At the oxygen partial pressure of 5 Pa, in the amorphous film formed with the InGaO$_3$(ZnO)$_4$ target, the electron carrier concentration was $1\times10^{16}$/cm$^3$, the electro conductivity was $1\times10^{-2}$ S/cm, and the electron mobility therein was estimated to be about 5 cm$^2$/V·sec. From the analysis of the light absorption spectrum, the optical band gap energy breadth of the formed amorphous oxide film was estimated to be about 3 eV.

The higher oxygen partial pressure further lowered the electron carrier concentration. As shown in FIG. 1, in the In—Zn—Ga—O type amorphous oxide film formed at a substrate temperature of 25° C. at an oxygen partial pressure of 6 Pa, the electron carrier concentration was lowered to $8\times10^{15}$/cm$^3$ (electroconductivity: about $8\times10^{-3}$ S/cm). The electron mobility in the film was estimated to be 1 cm$^2$/V·sec or more. However, by the PLD process, at the oxygen partial pressure of 6.5 Pa or higher, the deposited film has a rough surface, being not suitable for use as the channel layer of the TFT.

The In—Zn—Ga—O type amorphous oxide films were formed at various oxygen partial pressures in the film-forming atmosphere with the target constituted of a polycrystalline sintered compact having the composition of InGaO$_3$(ZnO)$_4$. The resulting films were examined for the relation between the electron carrier concentration and the electron mobility. FIG. 2 shows the results. Corresponding to the increase of the electron carrier concentration from $1\times10^{16}$/cm$^2$ to $1\times10^{20}$/cm$^2$, the electron mobility increased from about 3 cm$^2$/V·sec to about 11 cm$^2$/V·sec. The same tendency was observed with the amorphous oxide films obtained with the polycrystalline sintered InGaO$_3$(ZnO) target.

The In—Zn—Ga—O type amorphous oxide film which was formed on a 200 μm-thick polyethylene terephthalate (PET) film in place of the glass substrate had similar characteristics.

(Formation of In—Zn—Ga—Mg—O Type Amorphous Oxide Film by PLD Process)

A film of InGaO$_3$(Zn$_{1-x}$Mg$_x$O)$_4$ (0<x·1) was formed on a glass substrate by a PLD process with an InGaO$_3$(Zn$_{1-x}$Mg$_x$O)$_4$ target (0<x·1). The apparatus employed was the one shown in FIG. 7.

An SiO$_2$ glass substrate (Corning Co.: 1737) was used as the substrate. As the pretreatment, the substrate was washed ultrasonically for defatting with acetone, ethanol, and ultra-pure water each for five minutes, and dried in the air at 100° C. The target was a sintered compact of InGaO$_3$(Zn$_{1-x}$Mg$_x$O)$_4$ (x=1–0) (size: 20 mm diameter, 5 mm thick).

The target was prepared by wet-mixing source materials In$_2$O$_3$, Ga$_2$O$_3$, and ZnO (each 4N reagent) (solvent: ethanol), calcining the mixture (1000° C., 2 hours), dry-crushing it, and sintering it (1550° C., 2 hours). The final pressure in the growth chamber was $2\times10^{-6}$ Pa. The oxygen partial pressure during the growth was controlled at 0.8 Pa. The substrate temperature was room temperature (25° C.). The distance between the target and the substrate for film formation was 30 mm. The KrF excimer laser was irradiated at a power of 1.5 mJ/cm$^2$/pulse with the pulse width of 20 nsec, the repeating frequency of 10 Hz, and the irradiation spot size of 1×1 mm square. The film-forming rate was 7 nm/min. The oxygen partial pressure in the film-forming atmosphere was 0.8 Pa. The substrate temperature was 25° C.

The resulting thin film was examined by small angle X-ray scattering method (SAXS) (thin film method, incidence angle: 0.5°): no clear diffraction peak was observed. Thus the obtained In—Ga—Zn—Mg—O type thin film was amorphous. The resulting film had a flat surface.

By using targets of different x-values (different Mg content), In—Zn—Ga—Mg—O type amorphous oxide films were formed at the oxygen partial pressure of 0.8 Pa in a film-forming atmosphere to investigate the dependency of the conductivity, the electron carrier concentration, and the electron mobility on the x-value.

Figure 4A:
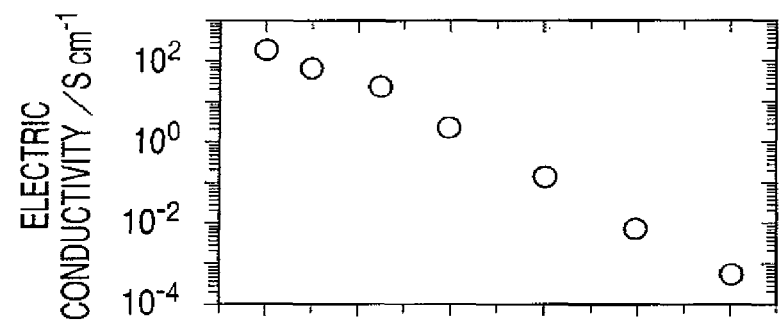
FIGS. 4A, 4B and 4C show graphs showing respectively changes of electric conductivity, carrier concentration, and electron mobility versus value x of a film having a composition of $InGaO_3(Zn_{1-x}Mg_xO)$ formed by a pulse laser deposition method in an oxygen atmosphere having an oxygen partial pressure of 0.8 Pa.
Figure 4B:
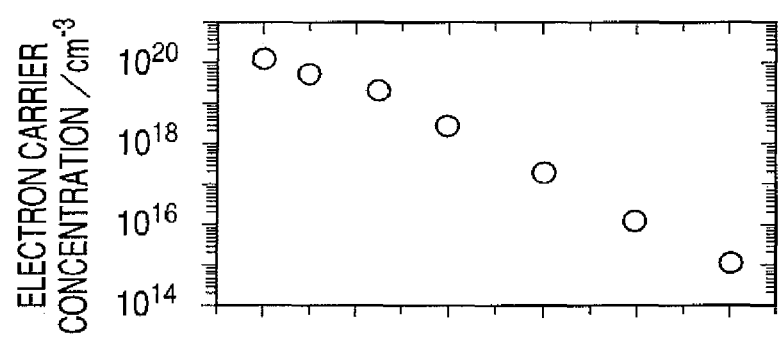
Figure 4C:
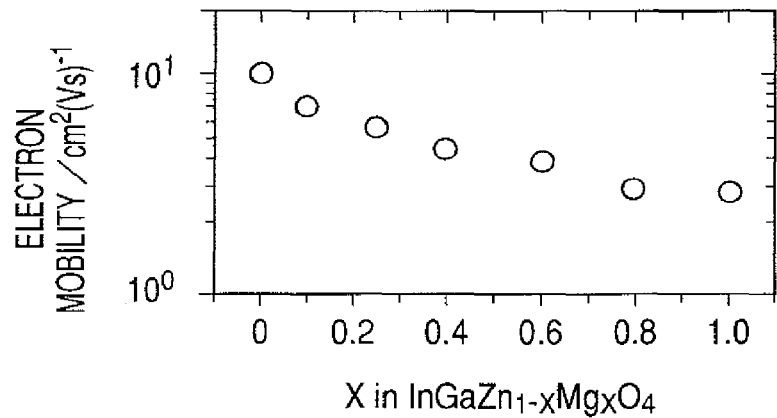

FIGS. 4A, 4B, and 4C show the results. At the x values higher than 0.4, in the amorphous oxide films formed by the PLD process at the oxygen partial pressure of 0.8 Pa in the atmosphere, the electron carrier concentration was decreased to be less than $1\times10^{18}$/cm$^3$. In the amorphous film of x value higher than 0.4, the electron mobility was higher than 1 cm$^2$/V.

As shown in FIGS. 4A, 4B, and 4C, the electron carrier concentration less than $1\times10^{16}$/cm$^3$ could be achieved in the film prepared by a pulse laser deposition process with the target in which 80 atom % of Zn is replaced by Mg and at the oxygen partial pressure of 0.8 Pa (electric resistance: about $1\times10^{-2}$ S·cm). In such a film, the electron mobility is decreased in comparison with the Mg-free film, but the decrease is slight. The electron mobility in the films is about 5 cm$^2$/V·sec, which is higher by about one digit than that of amorphous silicon. Under the same film formation conditions, both the electric conductivity and the electron mobility in the film decrease with increase of the Mg content. Therefore, the Mg content in the film is preferably more than 20 atom % and less than 85 atom % (0.2<x<0.85), more preferably 0.5<x<0.85.

The amorphous film of InGaO$_2$(Zn$_{1-x}$Mg$_x$O)$_4$ (0<x·1) formed on a 200 μm-thick polyethylene terephthalate (PET) film in place of the glass substrate had similar characteristics.

(Formation of In$_2$O$_3$ Amorphous Oxide Film by PLD Process)

An In$_2$O$_3$ film was formed on a 200 μm-thick PET film by use of a target constituted of In$_2$O$_3$ polycrystalline sintered compact by a PLD process employing a KrF excimer laser.

The apparatus used is shown in FIG. 7. The substrate for the film formation was an SiO$_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was an In$_2$O$_3$ sintered compact (size: 20 mm diameter, 5 mm thick), which had been prepared by calcining the source material In$_2$O$_3$ (4N reagent) (1000° C., 2 hours), dry-crushing it, and sintering it (1550° C., 2 hours).

The final vacuum of the growth chamber was 2×10$^6$ Pa, the oxygen partial pressure during the growth was 5 Pa, and the substrate temperature was 25° C.

The water vapor partial pressure was 0.1 Pa, and oxygen radicals were generated by the oxygen radical-generating assembly by application of 200 W.

The distance between the target and the film-holding substrate was 40 mm, the power of the Krf excimer laser was 0.5 mJ/cm$^2$/pulse, the pulse width was 20 nsec, the repeating frequency was 10 Hz, and the irradiation spot size was 1×1 mm square.

The film-forming rate was of 3 nm/min.

The resulting thin film was examined by small angle X-ray scattering method (SAXS) (thin film method, incidence angle: 0.5°): no clear diffraction peak was observed, which shows that the obtained In—O type oxide film was amorphous. The film thickness was 80 nm.

In the obtained In—O type amorphous oxide film, the electron carrier concentration was 5×10$^{17}$/cm$^3$, and the electron mobility was about 7 cm$^2$/V·sec.

(Formation of In—Sn—O Type Amorphous Oxide Film by PLD Process)

An In—Sn—O type oxide film was formed on a 200 μm-thick PET film by use of a target constituted of polycrystalline sintered compact of (In$_{0.9}$Sn$_{0.1}$)O$_{3.1}$ by a PLD process employing a KrF excimer laser. The apparatus used is shown in FIG. 7.

The substrate for the film formation was an SiO$_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was an In$_2$O$_3$—SnO$_2$ sintered compact (size: 20 mm diameter, 5 mm thick), which had been prepared by wet-mixing the source materials In$_2$O$_3$—SnO$_2$ (4N reagents) (solvent: ethanol), calcining the mixture (1000° C., 2 hours), dry-crushing it, and sintering it (1550° C., 2 hours).

The substrate was kept at room temperature. The oxygen partial pressure was 5 Pa. The nitrogen partial pressure was 0.1 Pa. Oxygen radicals were generated by the oxygen radical-generating assembly by application of 200 W.

The distance between the target and the film-holding substrate was 30 mm, the power of the Krf excimer laser was 1.5 mJ/cm$^2$/pulse, the pulse width was 20 nsec, the repeating frequency was 10 Hz, and the irradiation spot size was 1×1 mm square.

The film-forming rate was of 6 nm/min.

The resulting thin film was examined by small angle X-ray scattering method (SAXS) (thin film method, incidence angle: 0.5°): no clear diffraction peak was detected, which shows that the obtained In—Sn—O type oxide film is amorphous.

In the obtained In—Sn—O type amorphous oxide film, the electron carrier concentration was 8×10$^{17}$/cm$^3$, and the electron mobility was about 5 cm$^2$/V·sec. The film thickness was 100 nm.

(Formation of In—Ga—O Type Amorphous Oxide Film by PLD Process)

The substrate for the film was an SiO$_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was a sintered compact of (In$_2$O$_3$)$_{1-x}$—(Ga$_2$O$_3$)$_x$ (x=0-1) (size: 20 mm diameter, 5 mm thick). For instance, at x=0.1, the target is a polycrystalline sintered compact of (In$_{0.9}$Ga$_{0.1}$)$_2$O$_2$.

This target was prepared by wet-mixing the source materials In$_2$O$_3$—Ga$_2$O$_2$ (4N reagents) (solvent: ethanol), calcining the mixture (1000° C., 2 hours), dry-crushing it, and sintering it (1550° C., 2 hours).

The final pressure of the growth chamber was 2×10$^{-6}$ Pa. The oxygen partial pressure during the growth was 1 Pa.

The substrate was at room temperature. The distance between the target and the film-holding substrate was 30 mm. The power of the Krf excimer laser was 1.5 mJ/cm$^2$/pulse. The pulse width was 20 nsec. The repeating frequency was 10 Hz. The irradiation spot size was 1×1 mm square. The film-forming rate was of 6 nm/min.

The substrate temperature was 25° C. The oxygen pressure was 1 Pa. The resulting film was examined by small angle X-ray scattering method (SAXS) (thin film method, incidence angle: 0.5°): no clear diffraction peak was detected, which shows that the obtained In—Ga—O type oxide film is amorphous. The film thickness was 120 nm.

In the obtained In—Ga—O type amorphous oxide film, the electron carrier concentration was 8×10$^{16}$/cm$^2$, and the electron mobility was about 1 cm$^2$/V·sec.

(Preparation of TFT Element Having In—Zn—Ga—O Type Amorphous Oxide Film (Glass Substrate))

A top gate type TFT element shown in FIG. 5 was prepared.

Firstly, an In—Ga—Zn—O type amorphous oxide film was prepared on glass substrate 1 by the aforementioned PLS apparatus with a target constituted of a polycrystalline sintered compact having a composition of InGaO$_3$(ZnO)$_4$ at an oxygen partial pressure of 5 Pa. The formed In—Ga—Zn—O film had a thickness of 120 nm, and was used as channel layer 2.

Further thereon, another In—Ga—Zn—O type amorphous film having a higher electro conductivity and a gold layer were laminated, each in 30 nm thick, by the PLD method at the oxygen partial pressure of lower than 1 Pa in the chamber. Therefrom drain terminal 5 and source terminal 6 were formed by photolithography and a lift-off method.

Finally, a Y$_2$O$_3$ film as gate insulator 3 was formed by electron beam vapor deposition (thickness: 90 nm, relative dielectric constant: about 15, leakage current density: 1×10$^3$ A/cm$^2$ under application of 0.5 MV/cm). Further thereon, a gold film was formed and therefrom gate terminal 4 was formed by photolithography and a lift-off method. The channel length was 50 μm, and the channel width was 200 μm.

Evaluation of Characteristics of TFT Element

FIG. 6 shows current-voltage characteristics of the TFT element at room temperature. Drain current I$_{DS}$ increased with increase of drain voltage V$_{DS}$, which shows that the channel is of an n-type conduction.

This is consistent with the fact that an amorphous In—Ga—Zn—O type semiconductor is of an n-type. The $I_{DS}$ become saturated (pinched off) at $V_{DS}$=6V, which is typical behavior of a semiconductor transistor. From examination of the gain characteristics, the threshold value of the gate voltage $V_{GS}$ under application of $V_{DS}$=4V was found to be about −0.5 V. A current flow of $I_{DS}$=1.0×10⁻⁵ A was cased at $V_G$=10V. This corresponds to carrier induction by a gate bias in the In—Ga—Zn—O type amorphous semiconductor thin film as the insulator.

The on-off ratio of the transistor was higher than 1×10³. From the output characteristics, the field effect mobility was calculated to be about 7 cm²(Vs)⁻¹ in the saturation region. Irradiation of visible light did not change the transistor characteristics of the produced element according to the same measurement.

The amorphous oxide of the electron carrier concentration lower than 1×10¹⁸/cm³ is useful as a channel layer of a TFT. The electron carrier concentration is more preferably less than 1×10¹⁷/cm³, still more preferably less than 1×10¹⁶/cm³.

(Preparation of TFT Element Having In—Zn—Ga—O Type Amorphous Oxide Film (Amorphous Substrate))

A top gate type TFT element shown in FIG. 5 was prepared.

Firstly, an In—Ga—Zn—O type amorphous oxide film was prepared on polyethylene terephthalate (PET) film 1 by the aforementioned PLS apparatus with a target constituted of a polycrystalline sintered compact having a composition of InGaO₃(ZnO) at an oxygen partial pressure of 5 Pa in the atmosphere. The formed film had a thickness of 120 nm, and was used as channel layer 2.

Further thereon, another In—Ga—Zn—O type amorphous film having a higher electro conductivity and a gold layer were laminated, each in 30 nm thick, by the PLD method at the oxygen partial pressure of lower than 1 Pa in the chamber. Therefrom drain terminal 5 and source terminal 6 were formed by photolithography and a lift-off method.

Finally, gate insulator 3 was formed by an electron beam vapor deposition method. Further thereon, a gold film was formed and therefrom gate terminal 4 was formed by photolithography and a lift-off method. The channel length was 50 μm, and the channel width was 200 μm. Three TFTs of the above structure were prepared by using respectively one of the three kinds of gate insulators: Y₂O₃ (140 nm thick), Al₂O₃ (130 μm thick), and HfO₂ (140 μm thick).

Evaluation of Characteristics of TFT Element

The TFT elements formed on a PET film had current-voltage characteristics similar to that shown in FIG. 6 at room temperature. Drain current $I_{DS}$ increased with increase of drain voltage $V_{DS}$, which shows that the channel is of an n-type conduction. This is consistent with the fact that an amorphous In—Ga—Zn—O type semiconductor is of an n type. The $I_{DS}$ become saturated (pinched off) at $V_{DS}$=6V, which is typical behavior of a semiconductor transistor. A current flow of $I_{DS}$=1.0×10⁻⁸ A was caused at $V_G$=0 V, and a current flow of $I_{DS}$=2.0×10⁻⁵ A was caused at $V_G$=10 V. This corresponds to carrier induction by gate bias in the insulator, the In—Ga—Zn—O type amorphous semiconductor oxide film.

The on-off ratio of the transistor was higher than 1×10³. From the output characteristics, the field effect mobility was calculated to be about 7 cm²(Vs)⁻¹ in the saturation region.

The elements formed on the PET film were curved at a curvature radius of 30 mm, and in this state, transistor characteristics were measured. However the no change was observed in the transistor characteristics. Irradiation of visible light did not change the transistor characteristics.

The TFT employing the Al₂O₃ film as the gate insulator has also transistor characteristics similar to that shown in FIG. 6. A current flow of $I_{DS}$=1.0×10⁻⁸ A was caused at $V_G$=0 V, and a current flow of $I_{DS}$=5.0×10⁻⁶ A was caused at $V_G$=10 V. The on-off ratio of the transistor was higher than 1×10². From the output characteristics, the field effect mobility was calculated to be about 2 cm²(Vs)⁻¹ in the saturation region.

The TFT employing the HfO₂ film as the gate insulator has also transistor characteristics similar to that shown in FIG. 6. A current flow of $I_{DS}$=1×10⁻⁸ A was caused at $V_G$=0 V, and a current flow of $I_{DS}$=1.0×10⁻⁶ A was caused at $V_G$=10 V. The on-off ratio of the transistor was higher than 1×10². From the output characteristics, the field effect mobility was calculated to be about 10 cm²(Vs)⁻¹ in the saturation region.

(Preparation of TFT Element Employing In₂O₃ Amorphous Oxide Film by PLD Process)

A top gate type TFT element shown in FIG. 5 was prepared.

Firstly, an In₂O₃ type amorphous oxide film was formed on polyethylene terephthalate (PET) film 1 by the PLD method as channel layer 2 in a thickness of 80 nm.

Further thereon, another In₂O₃ amorphous film having a higher electro conductivity and a gold layer were laminated, each in 30 nm thick, by the PLD method at the oxygen partial pressure of lower than 1 Pa in the chamber, and at the voltage application of zero volt to the oxygen radical generating assembly. Therefrom drain terminal 5 and source terminal 6 were formed by photolithography and a lift-off method.

Finally, a Y₂O₃ film as gate insulator 3 was formed by an electron beam vapor deposition method. Further thereon, a gold film was formed and therefrom gate terminal 4 was formed by photolithography and a lift-off method.

Evaluation of Characteristics of TFT Element

The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—O type amorphous oxide film is an n type conductor. The $I_{DS}$ become saturated (pinched off) at about $V_{DS}$=6 V, which is typical behavior of a transistor. A current flow of $I_{DS}$=2×10⁻⁸ A was caused at $V_G$=0 V, and a current flow of $I_{DS}$=2.0×10⁻⁶ A was caused at $V_G$=10 V. This corresponds to electron carrier induction by gate bias in the insulator, the In—O type amorphous oxide film.

The on-off ratio of the transistor was about 1×10². From the output characteristics, the field effect mobility was calculated to be about 1×10 cm²(Vs)⁻¹ in the saturation region. The TFT element formed on a glass substrate had similar characteristics.

The elements formed on the PET film were curved in a curvature radius of 30 mm, and in this state, transistor characteristics were measured. No change was observed in the transistor characteristics.

(Preparation of TFT Element Employing In—Sn—O Type Amorphous Oxide Film by PLD Process)

A top gate type TFT element shown in FIG. 5 was prepared.

Firstly, an In—Sn—O type amorphous oxide film was formed in a thickness of 100 nm as channel layer 2 on polyethylene terephthalate (PET) film 1 by the PLD method.

Further thereon, another In—Sn—O amorphous film having a higher electro conductivity and a gold layer were laminated, each in 30 nm thick, by the PLD method at the oxygen partial pressure lower than 1 Pa in the chamber, and at voltage application of zero volt to the oxygen radical generating assembly. Therefrom drain terminal 5 and source terminal 6 were formed by photolithography and a lift-off method.

Finally, a $Y_2O_3$ film as gate insulator 3 was formed by an electron beam vapor deposition method. Further thereon, a gold film was formed and therefrom gate terminal 4 was formed by photolithography and a lift-off method.
Evaluation of Characteristics of TFT Element The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—Sn—O type amorphous oxide film is an n type conductor. The $I_{DS}$ became saturated (pinched off) at about $V_{DS}$=6 V, which is typical behavior of a transistor. A current flow of $I_{DS}$=5×10$^{-8}$ A was caused at $V_G$=0 V, and a current flow of $I_{DS}$=5.0×10$^{-5}$ A was caused at $V_G$=10 V. This corresponds to electron carrier induction by the gate bias in the insulator, the In—Sn—O type amorphous oxide film.

The on-off ratio of the transistor was about 1×10$^3$. From the output characteristics, the field effect mobility was calculated to be about 5 cm$^2$(Vs)$^{-1}$ in the saturation range. The TFT element formed on a glass substrate had similar characteristics.

The elements formed on the PET film were curved at a curvature radius of 30 mm, and in this state, transistor characteristics were measured. No change was caused thereby in the transistor characteristics.

(Preparation of TFT Element Employing In—Ga—O Type Amorphous Oxide Film by PLD Process)

A top gate type TFT element shown in FIG. 5 was prepared.

Firstly, an In—Ga—O type amorphous oxide film was formed in a thickness of 120 nm as channel layer 2 on polyethylene terephthalate (PET) film 1 by the PLD method shown in Example 6.

Further thereon, another In—Ga—O amorphous film having a higher conductivity and a gold layer were laminated, each in 30 nm thick, by the PLD method at the oxygen partial pressure of lower than 1 Pa in the chamber, and at the voltage application of zero volt to the oxygen radical-generating assembly. Therefrom drain terminal 5 and source terminal 6 were formed by photolithography and a lift-off method.

Finally, a $Y_2O_3$ film as gate insulator 3 was formed by an electron beam vapor deposition method. Further thereon, a gold film was formed and therefrom gate terminal 4 was formed by photolithography and a lift-off method.
Evaluation of Characteristics of TFT Element The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—Ga—O type amorphous oxide film is an n type conductor. The $I_{DS}$ became saturated (pinched off) at about $V_{DS}$=6 V, which is typical behavior of a transistor. A current flow of $I_{DS}$=1×10$^{-8}$ A was caused at $V_G$=0 V, and a current flow of $I_{DS}$=1.0×10$^{-6}$ A was caused at $V_G$=10 V. This corresponds to electron carrier induction by the gate bias in the insulator, the In—Ga—O type amorphous oxide film.

The on-off ratio of the transistor was about 1×10$^2$. From the output characteristics, the field effect mobility was calculated to be about 0.8 cm$^2$(Vs)$^{-1}$ in the saturation range. The TFT element formed on a glass substrate had similar characteristics.

The elements formed on the PET film were curved at a curvature radius of 30 mm, and in this state, transistor characteristics were measured. No change was caused thereby in the transistor characteristics.

The amorphous oxide of the electron carrier concentration of lower than 1×10$^{18}$/cm$^3$ is useful as the channel layer of the TFT. The electron carrier concentration is more preferably not higher than 1×10$^{17}$/cm$^3$, still more preferably not higher than 1×10$^{16}$/cm$^3$.

Now, Examples of the present invention will be explained.

Example 1: Preparation of an Amorphous In—Ga—Zn—O Thin Film Containing Microcrystals A film is prepared by using the apparatus shown in FIG. 7. A pulse laser deposition method using KrF excimer laser is performed with a polycrystalline sintered body having a composition of InGaO$_3$(ZnO)$_4$ as a target. On a glass substrate (1737, manufactured by Corning Incorporated), an In—Ga—Zn—O based amorphous oxide semiconductor thin film containing microcrystals is deposited. In the film formation step, a substrate surface is irradiated with a halogen lamp (20 mW/cm$^2$). The presence or absence of microcrystals is confirmed under TEM (transmission electron microscope) observation of a film section.
<Preparation of MISFET (Metal Insulator Semiconductor Field Effect Transistor) Device>

A top-gate type MISFET device shown in FIG. 5 is manufactured. First, a semi-insulating amorphous InGaO$_3$(ZnO)$_4$ film of 30 nm in thickness containing microcrystals and serving as a channel layer (2) is formed on the glass substrate (1) in accordance with the aforementioned method for preparing an amorphous In—Ga—Zn—O thin film containing microcrystals. Further on the resultant construct, InGaO$_3$(ZnO)$_4$ film and a gold film large in electric conductivity, each having 30 nm thickness, are stacked by a pulse laser deposition method while setting the oxygen partial pressure of a chamber at less than 1 Pa. Then, a drain terminal (5) and a source terminal (6) are formed by a photolithographic method and a lift-off method. Finally, an $Y_2O_3$ film serving as a gate insulator (3) is formed by an electron beam deposition method (the obtained film has a thickness of 90 to 110 nm, a specific dielectric constant of about 15, leak current density of 1×10$^3$ A/cm$^2$ when a current of 0.5 MV/cm is applied). Thereafter, a gold film is formed on the resultant construct, and then, a gate terminal (4) is formed by a photolithographic method and a lift-off method. In this manner, the field effect transistor is formed.

The on/off ratio of the transistor exceeds 1×10$^4$. When the field effect mobility is calculated based on power characteristics, an electron field-effect mobility of about 7.5 cm$^2$(Vs)$^{-1}$ was obtained in a saturation field. The device thus manufactured was irradiated with visible light and subjected to the same measurement. As a result, any change in the characteristics of a transistor was not observed.

Furthermore, in the aforementioned Example for manufacturing an In—Ga—Zn—O thin film containing microcrystals, effective results are obtained when the substrate is irradiated with light having a power density of 0.3 mW/cm$^2$ to 100 mW/cm$^2$. As a result, the on/off ratio of the transistor can be increased and large electron field-effect mobility can be obtained. For this reason, light irradiation is preferable.

Although it varies depending upon the amount of microcrystals in an amorphous oxide film, the presence of microcrystals is generally confirmed if a peak is detected by X-ray diffraction.

Example 2: Preparation of an Amorphous In—Ga—Zn—O Thin Film Having a Compositional Distribution in the Film Thickness Direction An In—Ga—Zn—O based amorphous oxide semiconductor thin film having a compositional distribution in the film thickness direction is deposited on a glass substrate (1737, manufactured by Corning Incorporated) by a pulse laser deposition method using KrF excimer laser with a polycrystalline sintered body having a composition of $InGaO_3(ZnO)_4$ as a target. The film is deposited in a chamber having inner oxygen partial pressure within a predetermined range while increasing the distance between the target and the substrate up to 5 mm. As the distance increases, the amount of oxygen incorporated into the formed film increases. Note that the temperature of the substrate is set at 25° C.

In the Example 2 (for forming a thin film having a compositional distribution in the film thickness direction), a composition may be changed by varying oxygen partial pressure in the film thickness direction, or alternatively, by changing an oscillation power or oscillation frequency of a pulse laser. In this manner, leak current can be reduced or the on/off ratio of a transistor can be increased, as well as electron field-effect mobility can be increased.

Example 3: Preparation of an Amorphous In—Ga—Zn—O Thin Film Having a Compositional Distribution in the Film Thickness Direction The film is formed by a sputtering method using argon gas. As targets, (1) a polycrystalline sintered body having a composition of $InGaO_3(ZnO)_4$ and (2) a zinc oxide sintered body are prepared. Then, an amorphous In—Ga—Zn—O thin film having a compositional distribution in the film thickness direction is deposited on a glass substrate (1737, manufactured by Corning Incorporated). The film is formed by the sputtering method in an atmosphere having a predetermined oxygen partial pressure, first by using target (1), subsequently by using target (1) and target (2), simultaneously. In this manner, the amorphous In—Ga—Zn—O thin film having a compositional distribution in the film thickness direction can be prepared. Note that the temperature of the substrate is set at 25° C.

The In—Ga—Zn—O thin film having a compositional distribution in the film thickness direction may be prepared by the following manner. The composition is distributed in the film thickness direction by sputtering an $In_2O_3$ target simultaneously or separately, or changing oxygen partial pressure in the film thickness direction, or alternatively, changing power supply in the film thickness direction for each target in a sputtering step. Particularly, in the amorphous thin film near a gate insulator, electron field-effect mobility is expected to increase as the amount of $In_2O_3$ or ZnO increases.

Example 4: Preparation of Amorphous In—Ga—Zn—O(N) Thin Film

A method of preparing an amorphous oxide containing nitrogen (N) as an additive will be explained.

An In—Ga—Zn—O based amorphous oxide semiconductor thin film containing nitrogen as an impurity (simply referred to as "In—Ga—Zn—O(N)") is deposited on a glass substrate of the same type as above by a pulse laser deposition method using KrF excimer laser with an $InGaO_3(ZnO)_4$ polycrystalline sintered body used as a target. Note that the oxygen partial pressure within a chamber is set at, for example, 4 Pa, the nitrogen partial pressure is set at 1 Pa, and the temperature of a substrate is set at 25° C. The compositional ratio of oxygen and nitrogen of the thin film is preferably about 50:1, as analyzed by a secondary ion mass spectrum (SIMS).

Example 5: Preparation of Amorphous In—Ga—Zn—O(Ti) Thin Film

An In—Ga—Zn—O based amorphous oxide semiconductor thin film is deposited on a glass substrate (1737, manufactured by Corning Incorporated) by a pulse laser deposition method using KrF excimer laser with a polycrystalline sintered body having a composition of $InGaO_3(ZnO)_4$ used as a target. The resultant In—Ga—Zn—O based thin film is soaked in an aqueous solution of titanium trichloride kept at 80° C. Thereafter, the film is taken up and annealed at 300° C. in the air. In this manner, Ti can be introduced as an impurity in the amorphous oxide. As the Ti concentration of the thin film is analyzed from the surface to the bottom by SIMS, the Ti concentration of the outermost surface is about 0.5% and gradually decreases toward the bottom.

An amorphous oxide according to the present invention is applicable to the channel layer of a transistor. Such a transistor can be used as switching devices for LCDs and organic EL displays. Alternatively, the amorphous oxide may be applied on a flexible material such as a plastic film to form a semiconductor thin film. Such a semiconductor thin film can be widely used as panels of flexible displays, IC cards and ID tags.

This application claims priority from Japanese Patent Application No. 2004-326687 filed on Nov. 10, 2004, which is hereby incorporated by reference herein.

What is claimed is:

1. An article with a field effect transistor comprising:
a substrate; and
a field effect transistor disposed on the substrate,
wherein the field effect transistor comprises an active layer comprising an amorphous oxide and a gate electrode formed so as to face the active layer through a gate insulator,
wherein the amorphous oxide comprises an oxide comprising In—Ga—Zn—O or In—Ga—Zn—Mg—O, and
wherein the amorphous oxide comprises one type of element or a plurality of elements selected from the group consisting of Li, Na, Mn, Ni, Pd, Cu, C, N, P, Ti, Ru and F.

2. The article according to claim 1, wherein the amorphous oxide exhibits a halo pattern and no characteristic diffraction line in an X-ray diffraction spectrometry.

3. The article according to claim 2, wherein the amorphous oxide has an electron carrier concentration of less than $10^{18}/cm^3$ at a temperature of 25° C.

4. The article according to claim 3, wherein the amorphous oxide is obtained by using a target having a composition $InGaO_3(ZnO)_m$ or $InGaO_3(Zn_{1-x}Mg_xO)_m$ in a crystalline state where m is a natural number of less than 6 and x is greater than 0 and not greater than 1.

5. An article with a field effect transistor comprising:
a substrate; and
a field effect transistor disposed on the substrate,
wherein the field effect transistor comprises an active layer comprising an amorphous oxide and a gate electrode formed so as to face the active layer through a gate insulator, and
wherein the amorphous oxide comprises an oxide comprising In—Ga—Zn—O or In—Ga—Zn—Mg—O, and
wherein the amorphous oxide comprises one type of element or a plurality of elements selected from the group consisting of Li, Na, Mn, Ni, Pd, Cu, C, N, P, Ti, Ru and F at a concentration within the range of 0.1 to 3 atomic %.

6. The article according to claim 5, wherein the amorphous oxide exhibits a halo pattern and no characteristic diffraction line in an X-ray diffraction spectrometry.

7. The article according to claim 6, wherein the amorphous oxide has an electron carrier concentration of less than $10^{18}/cm^3$ at a temperature of 25° C.

8. The article according to claim 7, wherein the amorphous oxide is obtained by using a target having a composition $InGaO_3(ZnO)_m$ or $InGaO_3(Zn_{1-x}Mg_xO)_m$ in a crystalline state where m is a natural number of less than 6 and x is greater than 0 and not greater than 1.

9. A display apparatus with a field effect transistor comprising:
a substrate; and
a field effect transistor disposed on the substrate,
wherein the field effect transistor comprises an active layer comprising an amorphous oxide and a gate electrode formed so as to face the active layer through a gate insulator,
wherein the amorphous oxide comprises an oxide comprising In—Ga—Zn—O or In—Ga—Zn—Mg—O, and
wherein the amorphous oxide comprises at least one element selected from the group consisting of Li, Na, Mn, Ni, Pd, Cu, C, N, P, Ti, Ru, and F.

10. The display apparatus according to claim 9, wherein the amorphous oxide exhibits a halo pattern and no characteristic diffraction line in an X-ray diffraction spectrometry.

11. The display apparatus according to claim 10, wherein the amorphous oxide has an electron carrier concentration of less than $10^{18}/cm^3$ at a temperature of 25° C.

12. The display apparatus according to claim 11, wherein the amorphous oxide is obtained by using a target having a composition $InGaO_3(ZnO)_m$ or $InGaO_3(Zn_{1-x}Mg_xO)_m$ in a crystalline state where m is a natural number of less than 6 and x is greater than 0 and not greater than 1.

13. The display apparatus according to claim 9, wherein the display apparatus includes the field effect transistor as switching device.

14. The display apparatus according to claim 13, wherein the display is an organic EL display.

15. The display apparatus according to claim 14, wherein the display is a flexible display.

16. The display apparatus according to claim 13, wherein the display is an LCD.

17. A display apparatus with a field effect transistor comprising:
a substrate; and
a field effect transistor disposed on the substrate,
wherein the field effect transistor comprises an active layer comprising an amorphous oxide and a gate electrode formed so as to face the active layer through a gate insulator, and
wherein the amorphous oxide comprises an oxide comprising In—Ga—Zn—O or In—Ga—Zn—Mg—O, and
wherein the amorphous oxide comprises at least one element selected from the group consisting of Li, Na, Mn, Ni, Pd, Cu, C, N, P, Ti, Ru, and F at a concentration within the range of 0.1 to 3 atomic %.

18. The display apparatus according to claim 17, wherein the amorphous oxide exhibits a halo pattern and no characteristic diffraction line in an X-ray diffraction spectrometry.

19. The display apparatus according to claim 18, wherein the amorphous oxide has an electron carrier concentration of less than $10^{18}/cm^3$ at a temperature of 25° C.

20. The display apparatus according to claim 19, wherein the amorphous oxide is obtained by using a target having a composition $InGaO_3(ZnO)_m$ or $InGaO_3(Zn_{1-x}Mg_xO)_m$ in a crystalline state where m is a natural number of less than 6 and x is greater than 0 and not greater than 1.

21. The display apparatus according to claim 17, wherein the display apparatus includes the field effect transistor as switching device.

22. The display apparatus according to claim 21, wherein the display is an organic EL display.

23. The display apparatus according to claim 22, wherein the display is a flexible display.

24. The display apparatus according to claim 21, wherein the display is an LCD.

25. An article with a field effect transistor comprising:
a substrate; and
a field effect transistor disposed on the substrate,
wherein the field effect transistor comprises an active layer comprising an amorphous oxide and a gate electrode formed so as to face the active layer through a gate insulator, and
wherein the amorphous oxide comprises at least In, Ga and Zn or at least In, Ga, Zn and Mg, and further comprises one type of element or a plurality of elements selected from the group consisting of Li, Na, Mn, Ni, Pd, Cu, C, N, P, Ti, Ru and F.

26. The article according to claim 25, wherein the amorphous oxide exhibits a halo pattern and no characteristic diffraction line in an X-ray diffraction spectrometry.

27. The article according to claim 25, wherein the amorphous oxide has an electron carrier concentration of less than $10^{18}/cm^3$ at a temperature of 25° C.

28. The article according to claim 25, wherein the amorphous oxide is obtained by using a target having a composition $InGaO_3(ZnO)_m$ or $InGaO_3(Zn_{1-x}Mg_xO)_m$ in a crystalline state where m is a natural number of less than 6 and x is greater than 0 and not greater than 1.

* * * * *